(12) United States Patent
Han et al.

(10) Patent No.: US 11,071,222 B2
(45) Date of Patent: Jul. 20, 2021

(54) ELECTRONIC DEVICE INCLUDING METAL MATERIAL

(71) Applicant: Samsung Electronics Co., Ltd., Suwon-si (KR)

(72) Inventors: Yunjae Han, Suwon-si (KR); Myungsoo Kim, Suwon-si (KR); Halim Lee, Suwon-si (KR); Sunpyo Yun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/983,439

(22) Filed: Aug. 3, 2020

(65) Prior Publication Data

US 2020/0367379 A1  Nov. 19, 2020

Related U.S. Application Data

(63) Continuation of application No. 16/534,340, filed on Aug. 7, 2019, now Pat. No. 10,736,226.

(30) Foreign Application Priority Data

Aug. 8, 2018   (KR) .................. 10-2018-0092710

(51) Int. Cl.
*H05K 5/04* (2006.01)
*G06F 3/041* (2006.01)
(Continued)

(52) U.S. Cl.
CPC ............. *H05K 5/04* (2013.01); *G06F 3/0414* (2013.01); *H05K 5/0004* (2013.01);
(Continued)

(58) Field of Classification Search
None
See application file for complete search history.

(56) References Cited

U.S. PATENT DOCUMENTS 6,560,092 B2 * 5/2003 Itou ..................... G06F 1/1626
                                                              108/43
8,980,026 B2 * 3/2015 Ely ........................ H05K 5/062
                                                              156/83
(Continued)

FOREIGN PATENT DOCUMENTS

KR    10-2016-0097106 A    8/2016
KR    10-2017-0070636 A    6/2017
(Continued)

OTHER PUBLICATIONS

European Search Report dated Nov. 14, 2019; European Appln. No. 19190484.6-1221.

(Continued)

*Primary Examiner* — Xanthia C Cunningham
(74) *Attorney, Agent, or Firm* — Jefferson IP Law, LLP

(57) ABSTRACT

An electronic device is provided. The electronic device includes a housing including a first glass plate, a second glass plate opposite to the first glass plate, and a side member to surround a space between the first glass plate and the second glass plate, and a touch screen display disposed in the space and viewed through at least a portion of the first glass plate. The first glass plate includes a rectangular planar part including a first edge, which faces outward in a first direction and has a first length, and a second edge which extends perpendicularly to the first edge and has a second length longer than the first length, a first curved part including a first surface which extends from the first edge to a first part of the side member and faces the first part, and a second curved part including a second surface.

14 Claims, 15 Drawing Sheets

(51) Int. Cl.
*H05K 5/00* (2006.01)
*H05K 5/03* (2006.01)

(52) U.S. Cl.
CPC ............. *H05K 5/0017* (2013.01); *H05K 5/03* (2013.01); *G06F 2203/04105* (2013.01)

(56) References Cited

U.S. PATENT DOCUMENTS

| | | | |
|---|---|---|---|
| 9,274,568 B2* | 3/2016 | Pegg | G06F 1/1637 |
| 9,342,105 B2* | 5/2016 | Choi | G06F 3/0488 |
| 9,417,661 B2 | 8/2016 | McClure et al. | |
| 9,770,081 B2* | 9/2017 | Chao | H05K 5/061 |
| 9,943,018 B2* | 4/2018 | Park | H05K 1/0218 |
| 10,015,573 B2 | 7/2018 | Mittleman et al. | |
| 10,021,226 B2 | 7/2018 | Gagne-Keats et al. | |
| 10,048,721 B2 | 8/2018 | McClure et al. | |
| 10,051,096 B2 | 8/2018 | Baek et al. | |
| 10,056,204 B2 | 8/2018 | Lee et al. | |
| 10,062,322 B2 | 8/2018 | Evans et al. | |
| 10,070,030 B2 | 9/2018 | Evans et al. | |
| 10,116,777 B2 | 10/2018 | Kil et al. | |
| 10,129,989 B2* | 11/2018 | Kim | H05K 5/0004 |
| 10,171,636 B2 | 1/2019 | Yeo et al. | |
| 10,372,166 B2* | 8/2019 | Gable | H01Q 1/243 |
| 10,440,839 B2* | 10/2019 | Cheng | H05K 5/0017 |
| 2009/0245564 A1 | 10/2009 | Mittleman et al. | |
| 2011/0019351 A1* | 1/2011 | Bayne | G02F 1/133308 361/679.01 |
| 2012/0073115 A1* | 3/2012 | Filson | H04M 1/0266 29/592.1 |
| 2013/0314863 A1* | 11/2013 | Tanaka | H05K 5/06 361/679.01 |
| 2014/0206420 A1* | 7/2014 | Neichi | H04M 1/18 455/575.8 |
| 2015/0341072 A1* | 11/2015 | Lai | H04M 1/026 455/575.8 |
| 2016/0066440 A1 | 3/2016 | Choi et al. | |
| 2016/0147264 A1 | 5/2016 | Kil et al. | |
| 2016/0233037 A1 | 8/2016 | Lee et al. | |
| 2017/0121840 A1 | 5/2017 | Evans et al. | |
| 2018/0299924 A1 | 10/2018 | Seo et al. | |
| 2018/0343332 A1 | 11/2018 | Kim et al. | |
| 2019/0297741 A1* | 9/2019 | Pakula | G06F 1/1637 |

FOREIGN PATENT DOCUMENTS

| | | |
|---|---|---|
| KR | 10-1832774 B1 | 2/2018 |
| KR | 10-2018-0039522 A | 4/2018 |
| WO | 2018/070691 A1 | 4/2018 |

OTHER PUBLICATIONS

International Search Report dated Nov. 29, 2019; International Appln. No. PCT/KR2019/009973.

* cited by examiner

ELECTRONIC DEVICE INCLUDING METAL MATERIAL

CROSS-REFERENCE TO RELATED APPLICATION(S)

This application is a continuation application of prior application Ser. No. 16/534,340, filed on Aug. 7, 2019, which was based on and claimed priority under 35 U.S.C § 119(a) of a Korean patent application number 10-2018-0092710, filed on Aug. 8, 2018, in the Korean Intellectual Property Office, the disclosure of which is incorporated by reference herein in its entirety.

BACKGROUND

1. Field

The disclosure relates to an electronic device including a metal material.

2. Description of Related Art

An electronic device may include a housing including glass and a display provided inside the housing. A side surface of the housing of the electronic device may include a metal material. The glass may be supported by a side-surface structure of the housing.

The above information is presented as background information only to assist with an understanding of the disclosure. No determination has been made, and no assertion is made, as to whether any of the above might be applicable as prior art with regard to the disclosure.

SUMMARY

When an external impact is applied to the electronic device, the glass of the housing may be broken due to the metal structure at a side surface of the housing.

Aspects of the disclosure are to address at least the above-mentioned problems and/or disadvantages and to provide at least the advantages described below. Accordingly, an aspect of the disclosure is to provide an electronic device including a housing, in which a part to support the glass of the housing includes a soft injection material.

Additional aspects will be set forth in part in the description which follows and, in part, will be apparent from the description, or may be learned by practice of the presented embodiments In accordance with an aspect of the disclosure, an electronic device is provided. The electronic device includes a housing including a first glass plate, a second glass plate opposite to the first glass plate, and a side member to surround a space between the first glass plate and the second glass plate, and a touch screen display disposed in the space and viewed through at least a portion of the first glass plate. The first glass plate may include a rectangular planar part including a first edge, which faces outward in a first direction and has a first length, and a second edge which extends perpendicularly to the first edge and has a second length longer than the first length, a first curved part including a first surface which extends from the first edge to a first part of the side member and faces the first part, and a second curved part including a second surface which extends from the second edge to a second part of the side member and faces the second part. Each of the first part and the second part of the side member may include a metal part that forms an outer surface of the housing, and has a first inner surface facing the space in a second direction perpendicular to the first direction, and a polymer part that makes contact with the first inner surface and defines a recess to receive the first glass plate together with the metal part.

In accordance with another aspect of the disclosure, an electronic device is provided. The electronic device includes a housing structure including a first cover forming a first surface of the electronic device, a second cover forming a second surface of the electronic device, and a side member forming a third surface between the first surface and the second surface of the electronic device, and a display interposed between the first cover and the second cover. The side member may include a metal part forming the third surface of the electronic device and at least partially forming an inner surface of the side member, and a polymer part extending between the display and the second cover, from the metal part. The first cover may include a planar part facing a first direction, and a curved part curved toward the inner surface of the side member while surrounding the planar part. The curved part may include an end surface spaced apart from the inner surface of the side member by a specific distance while facing the inner surface of the side member.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

The following description with reference to the accompanying drawings is provided to assist in comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
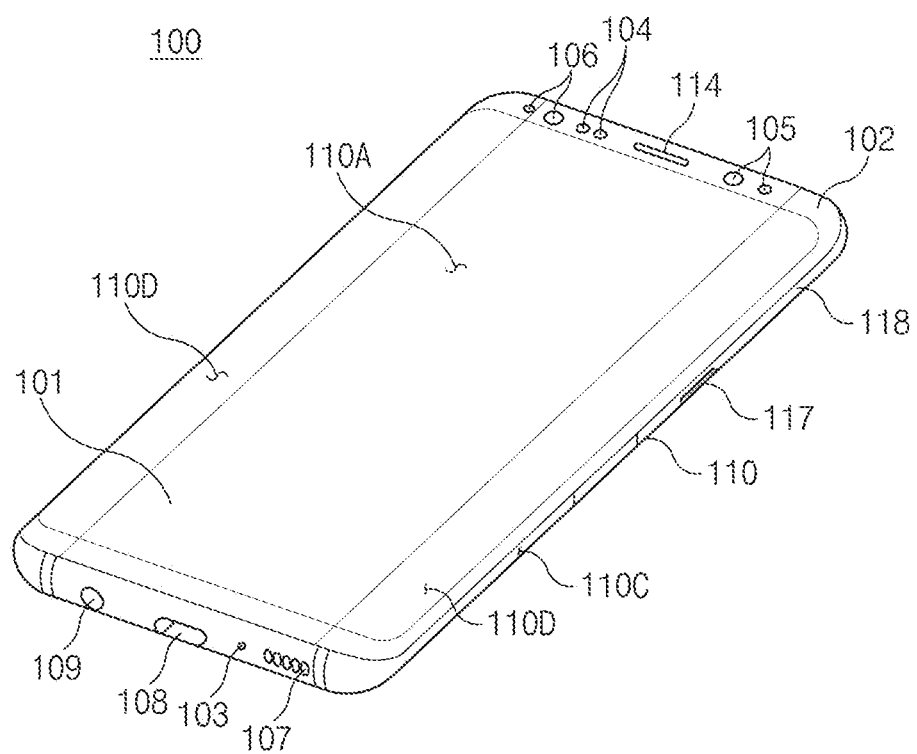
FIG. 1 is a perspective view illustrating a front surface of an electronic device, according to an embodiment of the disclosure.
Figure 2:
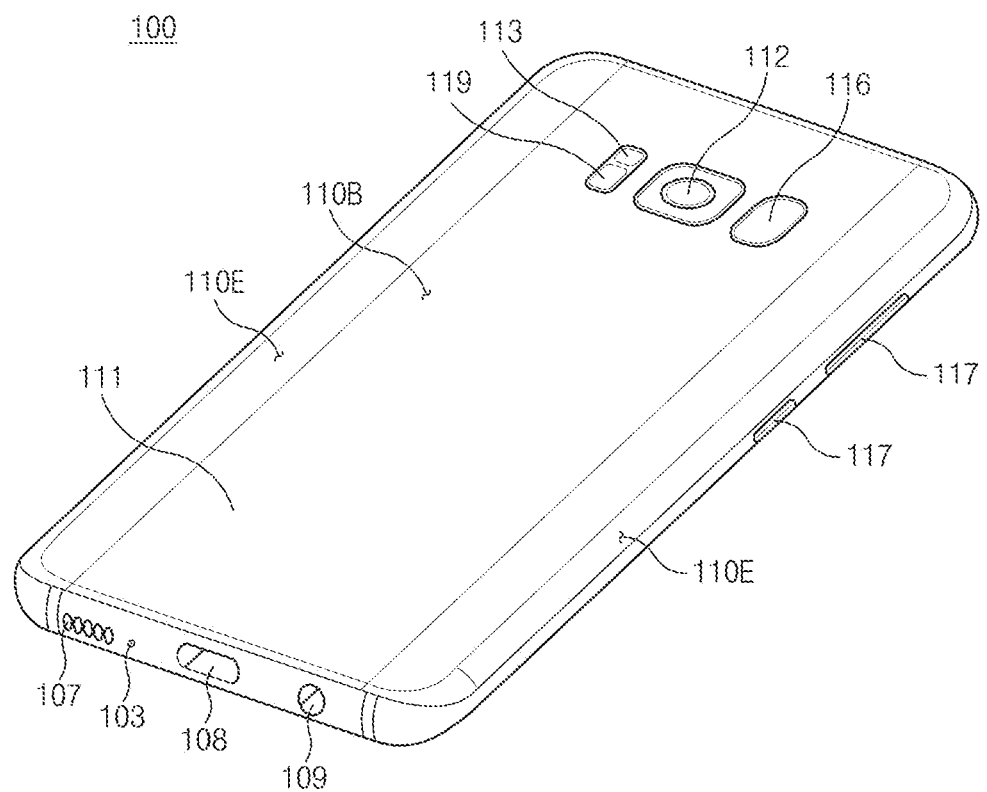
FIG. 2 is a perspective view illustrating a rear surface of the electronic device of FIG. 1, according to an embodiment of the disclosure.

FIGS. 1 and 2 are perspective views illustrating a front surface of an electronic device, according to various embodiments of the disclosure.

Referring to FIGS. 1 and 2, an electronic device 100 may include a housing 110 including a first surface 110A (or front surface), a second surface 110B (or rear surface), and a side surface 110C surrounding the space between the first surface 110A and the second surface 110B. In another embodiment (not illustrated), the housing may be referred to as the structure forming some of the first surface 110A, the second surface 110B, and the side surface 110C of FIG. 1. According to an embodiment, the first surface 110A may have at least a portion including a front plate 102 (e.g., a glass plate or a polymer plate including various coating layers) substantially transparent. The second surface 110B may include a rear plate 111 substantially transparent. The rear plate 111 may include, for example, coated or colored glass, ceramic, polymer, metal (e.g., aluminum, stainless steel (STS), or magnesium) or the combination of the above materials. The side surface 110C may include a side bezel structure (or "side member") 118 which is coupled to the front plate 102 and the rear plate 111, and includes metal and/or polymer. According to an embodiment, the rear plate 111 and the side bezel structure 118 may be formed integrally with each other and may include the same material (e.g., a metal material such as aluminum).

According to an embodiment illustrated, the front plate 102 may include two first areas 110D bent toward the rear plate 111 from the first surface 110A while seamlessly extending, at opposite long edge ends of the front plate 102. According to an embodiment illustrated (see FIG. 2), the rear plate 111 may include two second areas 110E bent toward the front plate 102 from the second surface 110B while seamlessly extending, at opposite long edge ends of the rear plate 111. According to an embodiment, the front plate 102 (or the rear plate 111) may include only one of the first areas 110D (or the second areas 110E). According to another embodiment, some of the first areas 110D or the second areas 110E may not be included. According to embodiments, when viewed from the side surface of the electronic device 100, the side bezel structure 118 may have a first thickness (or width) at the side having no first area 110D or second area 110E, and may have a second thickness thinner than the first thickness at the side including the first areas 110D or the second areas 110E.

According to an embodiment, the electronic device 100 includes a display 101, audio modules 103, 107 and 114, sensor modules 104, 116 and 119, camera modules 105, 112 and 113, a key input device 117, a light emitting device 106, and connector holes 108 and 109. According to an embodiment, the electronic device 100 may omit at least one (e.g., the key input device 117 or the light emitting device 106) of components or may include other components.

The display 101 may be exposed, for example, through a substantial portion of the front plate 102. According to an embodiment, at least a portion of the display 101 may be exposed through the front plate 102 including the first surface 110A and first areas 110D of the side surface 110C. According to an embodiment, a corner of the display 101 may be formed substantially identically to the shape of an adjacent outer portion of the front plate 102. According to another embodiment (not illustrated), to expand an area for exposing the display 101, the distance between an outer portion of the display 101 and an outer portion of the front plate 102 may be substantially uniformly formed.

In another embodiment (not illustrated), a recess or an opening is formed in a portion of a screen display area of the display 101. In addition, at least one of an audio module 114, a sensor module 104, a camera module 105, and a light emitting device 106 aligned in line with the recess or the opening may be included in the portion of the screen display area of the display 101. In another embodiment (not illustrated), at least one of the audio module 114, the sensor module 104, the camera module 105, a fingerprint sensor (e.g., sensor module 116), and a light emitting device 106 may be included in a rear surface of the screen display area of the display 101. In another embodiment (not illustrated), the display 101 may be coupled or disposed adjacent to a touch sensing circuit, a pressure sensor to measure the intensity (pressure) of a touch, and/or a digitizer to detect the stylus pen based on an electromagnetic scheme. In an embodiment, at least some of the sensor modules 104 and 119 and/or at least a portion of the key input device 117 may be disposed in the first areas 110D and/or the second areas 110E.

The audio modules 103, 107, and 114 may include, for example, a microphone hole 103 and speaker holes 107 and 114. The microphone hole 103 may have a microphone disposed therein to obtain an external sound. In an embodiment, the microphone hole 103 may have a plurality of microphones disposed therein to sense the direction of a sound. The audio modules 107 and 114 may include, for example, an external speaker hole 107 and a receiver hole 114 for conversation. In an embodiment, the speaker holes 107 and 114 and the microphone hole 103 may be implemented into one hole or a speaker may be included without the speaker holes 107 and 114 (e.g., a piezoelectric speaker).

In an embodiment, the sensor modules 104, 116, and 119 may generate electrical signals or data values corresponding to an internal operating state or an external environment state of the electronic device 100. The sensor modules 104, 116 and 119 may, for example, include a first sensor module 104 (e.g., a proximity sensor) and/or a second sensor module (not illustrated) (e.g., a fingerprint sensor) disposed on the first surface 110A of the housing 110, and/or a third sensor module 119 (e.g., a HRM sensor) and/or a fourth sensor module 116 disposed on the second surface 110B of the housing 110. The fingerprint sensor may be disposed on the second surface 110B as well as the first surface 110A (e.g., the display 101) of the housing 110. The electronic device 100 may further include a sensor module (not illustrated), for example, at least one of a gesture sensor, a gyro sensor, an air pressure sensor, a magnetic sensor, an acceleration sensor, a grip sensor, a color sensor, an infrared sensor, a biometric sensor, a temperature sensor, a humidity sensor, or an illuminance sensor.

The camera modules 105, 112 and 113 may include, for example, a first camera device 105 disposed on the first surface 110A of the electronic device 100 and a second camera device (e.g., camera module 112) and/or a flash (e.g., camera module 113) disposed on the second surface 110B. The camera devices 105 and 112 may include one or a plurality of lenses, an image sensor, and/or an image signal processor. The camera module 113 may include, for example, a light emitting diode or a xenon lamp. In an embodiment, two or more lenses (infrared camera, a wide-angle lens, and a telephoto lens) and image sensors may be disposed on one surface of the electronic device 100.

The key input device 117 may be disposed on the side surface 110C of the housing 110. In another embodiment, the electronic device 100 may not include some or an entire portion of the key input device 117 and the key input device 117 not included may be implemented in another form such as a soft key on the display 101. In another embodiment, the key input device 117 may include the sensor module 116 disposed on the second surface 110B of the housing 110.

The light emitting device 106 may be, for example, disposed on the first surface 110A of the housing 110. The light emitting device 106 may provide, for example, the status information of the electronic device 100 in an optical form. In another embodiment, the light emitting device 106 may provide, for example, a light source operating together with the operation of the cameral module 105. The light emitting device 106 may include, for example, LED, IR LED, and zenon lamps.

The connector holes 108 and 109 may include the first connector hole 108 to receive a connector (e.g., a USB connector) to transceive power and/or data together with the external electronic device and/or the second connector hole (e.g., an ear-phone jack) 109 to receive a connector to transceive an audio signal together with the external electronic device.

Figure 3:
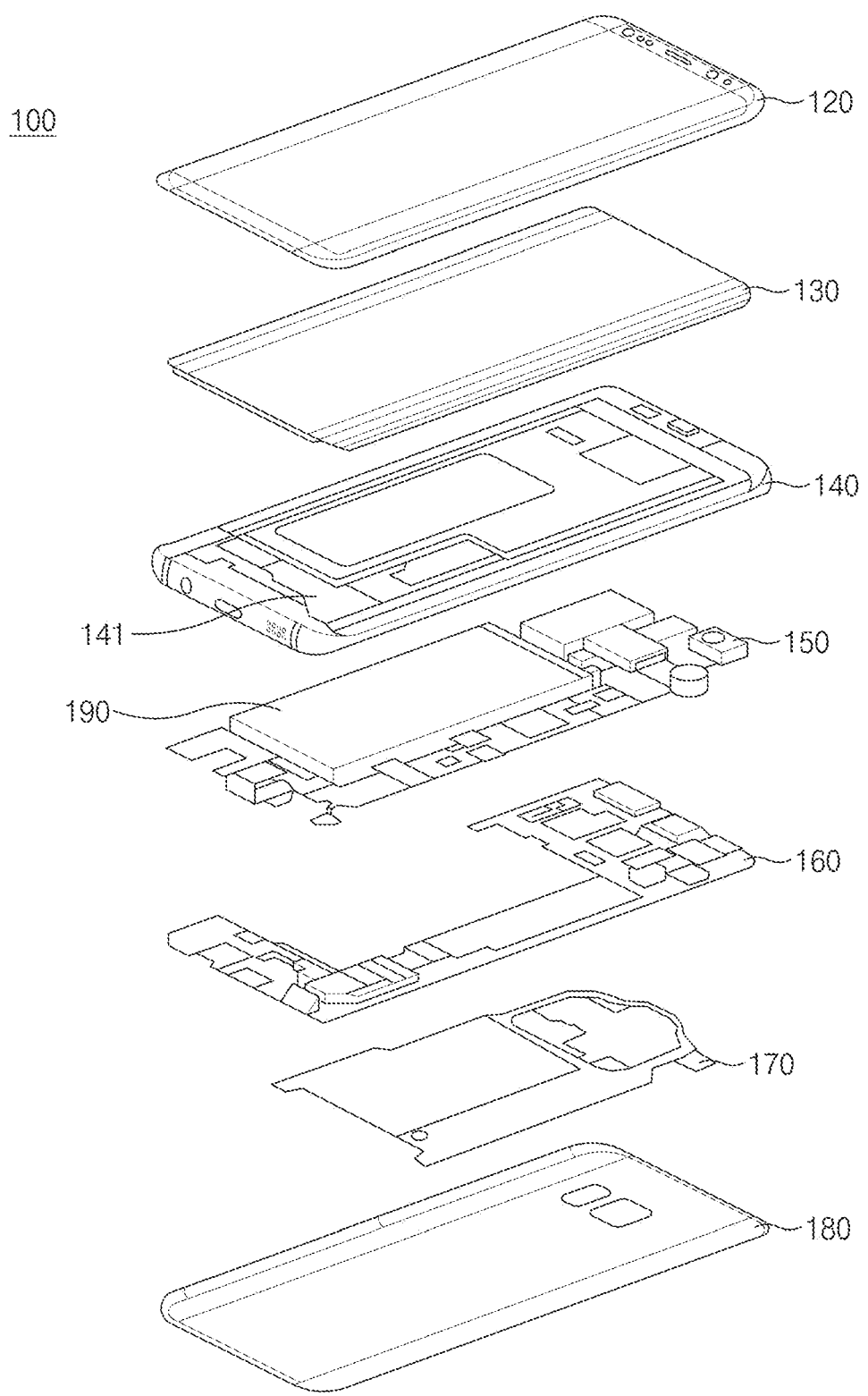
FIG. 3 is an exploded perspective view of an electronic device of FIG. 1, according to an embodiment of the disclosure.

FIG. 3 is an exploded perspective view of an electronic device of FIG. 1, according to an embodiment of the disclosure.

Referring to FIG. 3, the electronic device 100 may include the side bezel structure 140 (e.g., a side surface member), a first support member 141 (e.g., a bracket), the first cover 120, the display 130, a printed circuit board 150, a battery 190, a second support member 160 (e.g., a rear case), an antenna 170 and a rear plate 111. According to an embodiment, the electronic device 100 may omit at least one (e.g., the first support member 141 or the second support member 160) of components or may additionally include other components. At least one of components of the electronic device 100 may be identical to or similar to at least one of components of the electronic device 100 of FIG. 1 or FIG. 2, and the redundant details will be omitted.

The first support member 141 is disposed in the electronic device 100 to be coupled to the side bezel structure 140 or to be integrated with the side bezel structure 140. The first support member 141 may include, for example, a metal material and/or a non-metal material (e.g., polymer). The first support member 141 may have one surface coupled to the display 130 and an opposite surface coupled to the printed circuit board 150. A processor, a memory, and/or an interface may be mounted on the printed circuit board 150.

The processor may include, for example, one or more of a central processing unit, an application processor, a graphic processing unit, an image signal processor, a sensor hub processor, or a communication processor.

The memory may include, for example, a volatile memory and/or a non-volatile memory.

The interface may include, for example, a high definition multimedia interface (HDMI), a universal serial bus (USB) interface, an SD card interface, and/or an audio interface. The interface may, for example, electrically or physically connect the electronic device 100 with the external electronic device and may include a USB connector, an SD card/MMC connector, or an audio connector.

The battery 190 may include a device to supply power to at least one component of the electronic device 100, for example, a non-rechargeable primary battery, or a rechargeable secondary battery, or a fuel cell. At least a portion of the battery 190 may be, for example, on substantially the same plane on the printed circuit board 150. The battery 190 may be disposed inside the electronic device 100 integrally with the electronic device 100, and may be disposed detachably from the electronic device 100.

The antenna 170 may be interposed between the rear plate 111 and the battery 190. The antenna 170 may include, for example, a near field communication (NFC) antenna, a wireless charging antenna, and/or a magnetic secure transmission (MST) antenna. The antenna 170 may make local area network communication with an external device or may wirelessly transmit or receive power necessary for charging. In another embodiment, an antenna structure may be formed by a portion of the side bezel structure 140 and/or the first support member 141 or the combination of the side bezel structure 140 and the first support member 141.

Figure 4:
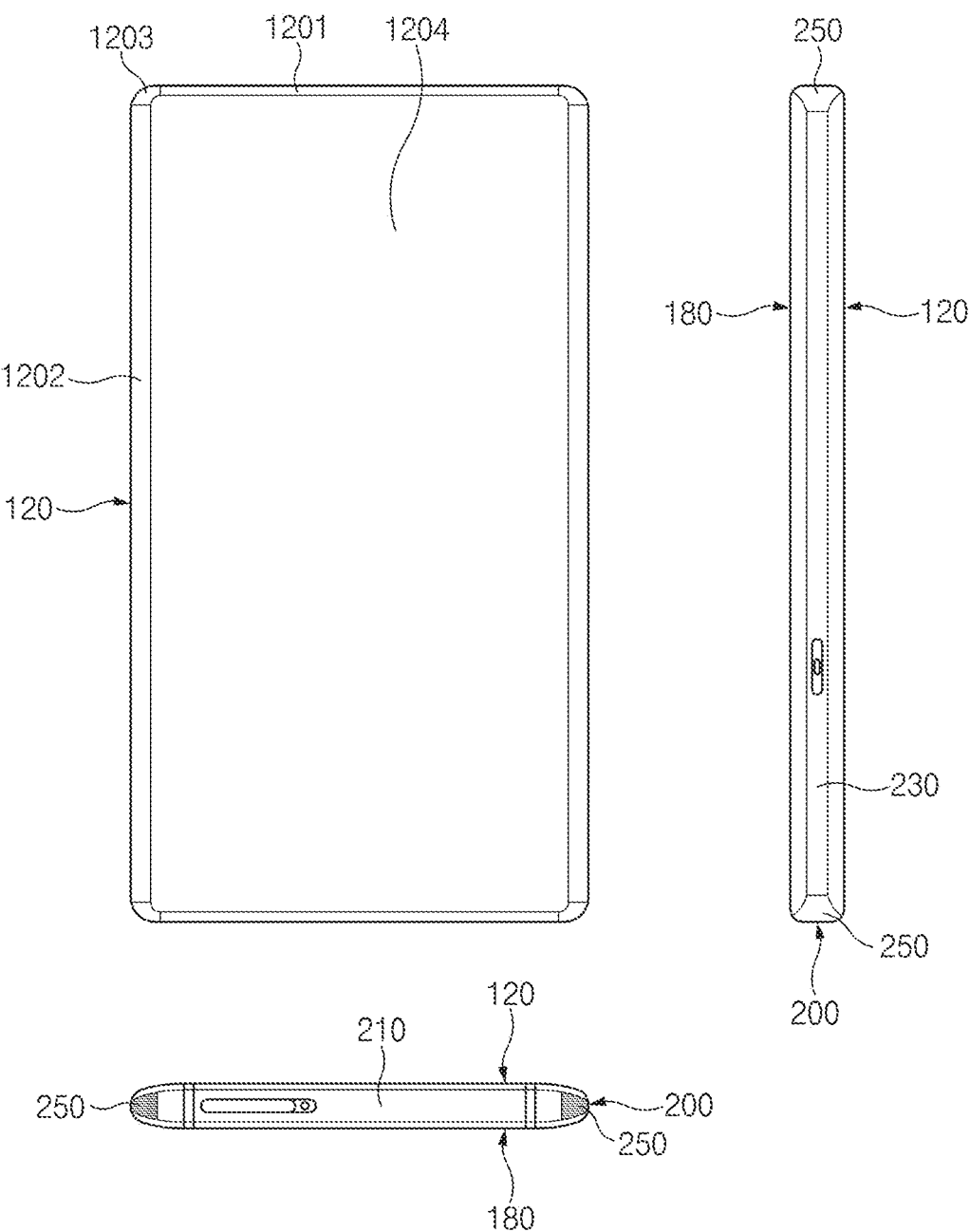
FIG. 4 illustrates a plan view and a side view of an electronic device, according to an embodiment of the disclosure.

FIG. 4 illustrates a plan view and a side view of an electronic device, according to an embodiment of the disclosure.

Figure 5:
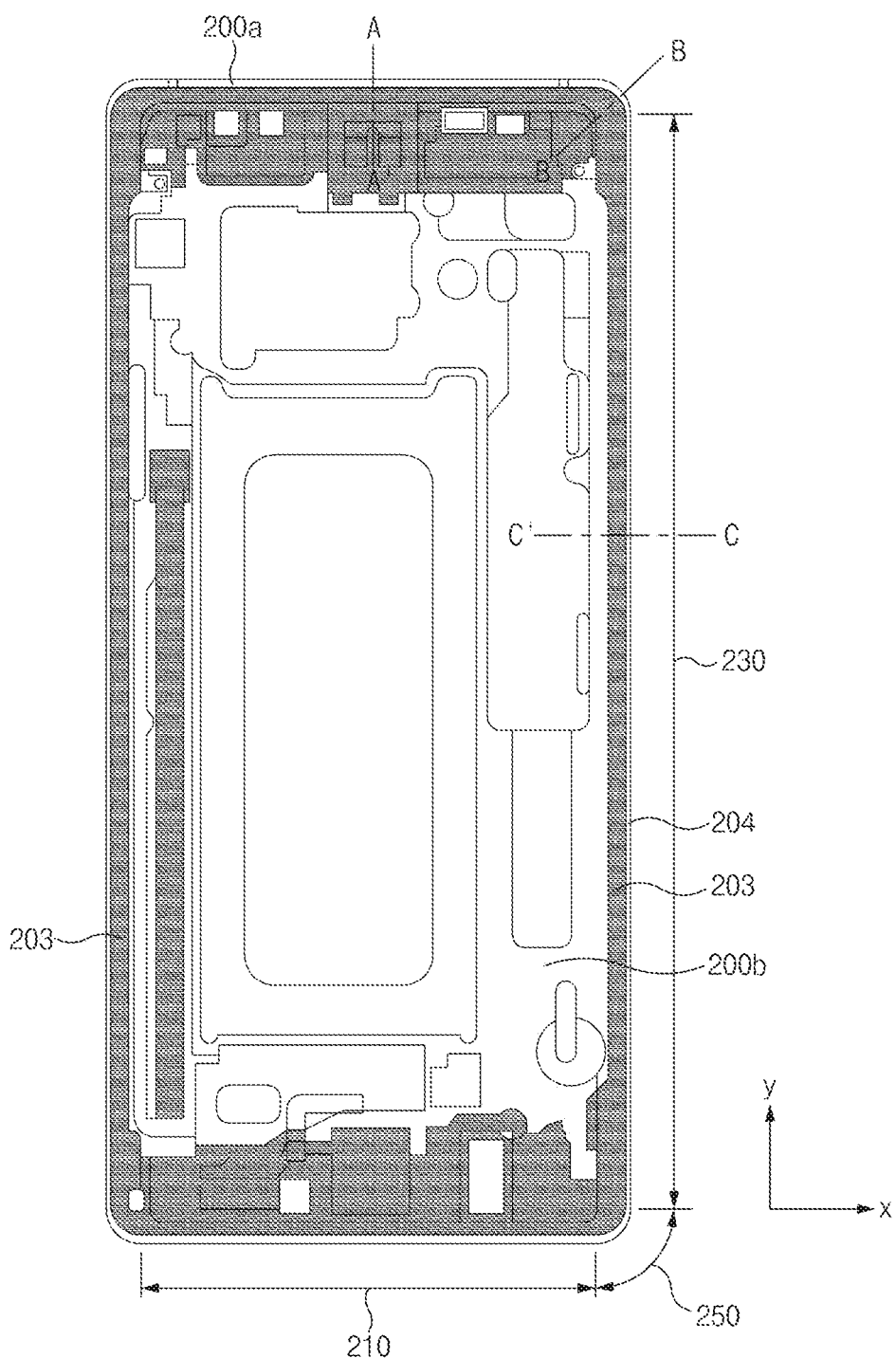
FIG. 5 is a plan view of a side member of an electronic device, according to an embodiment of the disclosure.

FIG. 5 is a plan view of a side member of the electronic device, according to an embodiment. The plan views of FIGS. 4 and 5 are plan views viewed in a first direction (a direction that the first cover 120 of FIG. 3 is viewed from the top)

Referring to FIG. 4, the first cover 120 (e.g., the first cover 120 of FIG. 3) may include a planar part 1204 facing the first direction and curved parts 1201, 1202, and 1203 to surround edges of the planar part 1204.

In another embodiment, the planar part 1204 may include a first peripheral portion extending in a direction perpendicular to the first direction and a second peripheral portion extending in a direction perpendicular to the extension direction of the first peripheral portion. The extension direction of the second peripheral portion may be perpendicular to the first direction that the planar part 1204 of the first cover 120 faces. The first peripheral portion may extend with a first length, and the second peripheral portion may extend with a second length longer than the first length.

The curved parts 1201, 1202, and 1203 may include a first curved part 1201 extending to a first curved part 1201 of the side member 200 from the first peripheral portion, a second curved part 1202 extending to the second part 230 of the side member 200 from the second peripheral portion, and a corner curved part 1203 connecting the first curved part 1201 and the second curved part 1202. The first curved part 1201 and the second curved-surface part 1202 may extend substantially perpendicularly to each other.

In various embodiments, the first curved part 1201, the second curved part 1202, and the corner curved part 1203 may be curved toward the first part 210, the second part 230, and the corner part 250 of the side member 200, respectively. For example, the curvature of the first curved part 1201 may be smaller than the curvature of the second curved part 1202, but the disclosure is not limited thereto. The curvature of the first curved part 1201 may be equal to or greater than the curvature of the second curved part 1202.

Referring to FIG. 5, the side member 200 (e.g., the side bezel structure 140 of FIG. 3) may include a first structure 200a (e.g., the first support member 141 of FIG. 3) forming a third surface (e.g., a side surface) of the electronic device 100 and a second structure 200b extending inward (e.g., the direction of facing the space between the first cover 120 and the second cover 180) of the electronic device 100 from the first structure 200a. In other words, the first structure 200a may form the outer appearance of the electronic device 100, and the second structure 200b may be not exposed to the outside of the electronic device 100, and may be interposed between the first cover 120 and the second cover 180. A printed circuit board (e.g., the printed circuit board 150 of FIG. 3) and a display (e.g., the display 130 of FIG. 3) may be disposed in the second structure 200b. The second structure 200b may have one or more openings and recesses for coupling the printed circuit board, the battery, or the rear case.

Referring to FIG. 5, the side member 200 may include a first part 210 extending in an x-axis direction, a second part 230 extending in a y-axis direction, and a corner part 250 connecting the second part 230 with the first part 210.

The first part 210 of the side member 200 may extend with a third length and the second part 230 of the side member 200 may extend to a fourth length longer than the third length. The corner part 250 of the side member 200 may include a curved surface having a predetermined curvature. The second part 230 may be connected to one side of one first corner part 250 and the first part 210 may be connected to an opposite side of the first corner part 250.

The first part 210 and the second part 230 are illustrated in a straight line and the corner part 250 may be illustrated in a curved line, when viewed from the illustrated plan view. In other words, the third surface, which forms the corner part 250, of the electronic device 100 may include a curved surface having a predetermined curvature. According to an embodiment, the first part 210 and the second part 230 may extend in the direction of the tangential line to the corner part 250.

Referring to FIG. 5, the side member 200 may be interposed between the first cover 120 (e.g., the first cover 120 of FIG. 3) and the second cover 180 (e.g., the rear plate 111 of FIG. 3). The second part 230 of the side member 200 may be less than the first part 210 of the second part 230 in thickness. In detail, the length between an edge formed by the first part 210 of the side member 200 and the second cover 180, and an edge formed by the first part 210 of the side member 200 and the first cover 120 may be longer than the length between an edge formed by the second part 230 of the side member 200 and the second cover 180 and an edge connecting between the second part 230 of the side member 200 and the first cover 120.

As illustrated in FIG. 5, the second part 230, which is adjacent to the second curved part 1202 having the largest curvature, of the side member 200 may have the lowest height in the first direction. In addition, the first part 210, which is adjacent to the first curved part 1201 having the smallest curvature, of the side member 200 may have the highest height in the first direction. The corner part 250 of the side member 200 may be formed lower than the first part 210 and higher than the second part 230. In detail, when viewed from the second cover 180 (or the plane on which the second cover 180 is placed), the length from the second cover 180 to the edge formed by the first curved part 1201 and the first part 210 of the side member 200 may be longer than the length from the second cover 180 to the edge formed by the second curved part 1202 and the second part 230 of the side member 200.

Figure 6A:
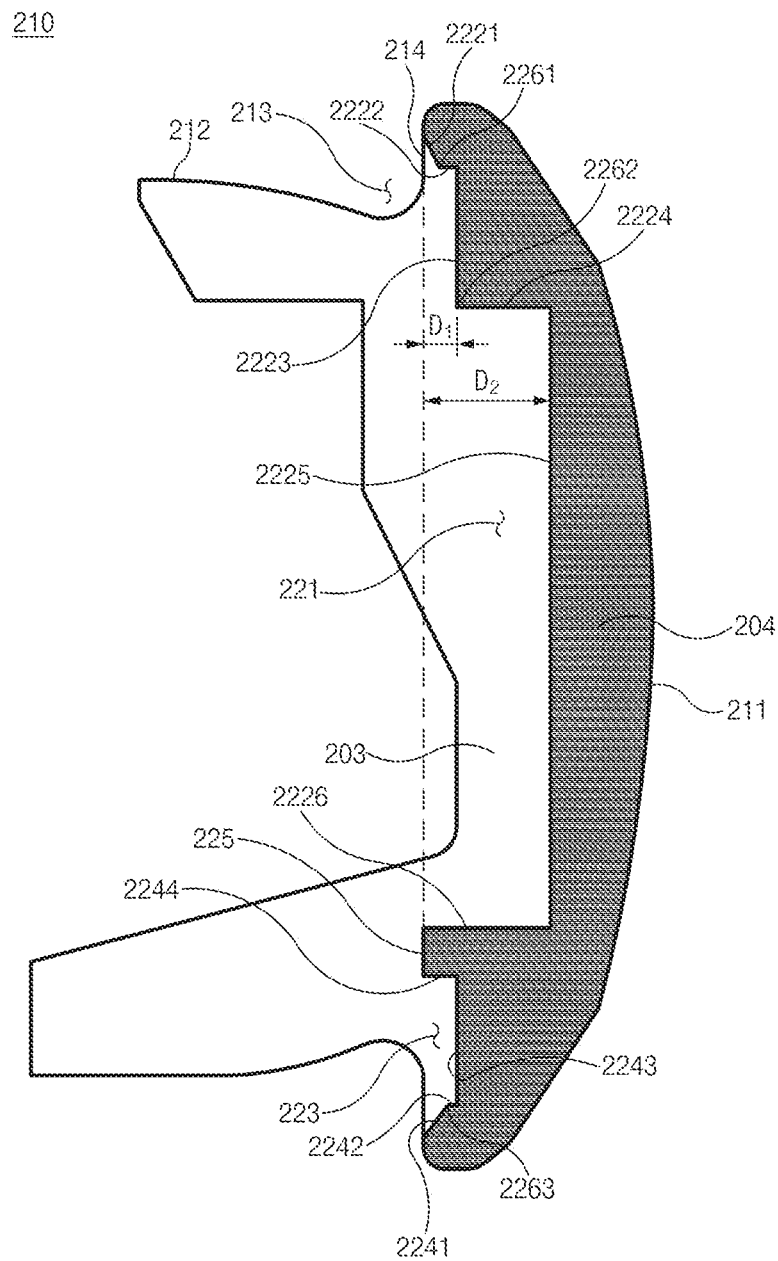
FIGS. 6A, 6B, and 6C are views illustrating a first part of the side member of an electronic device, according to various embodiments of the disclosure.
Figure 6B:
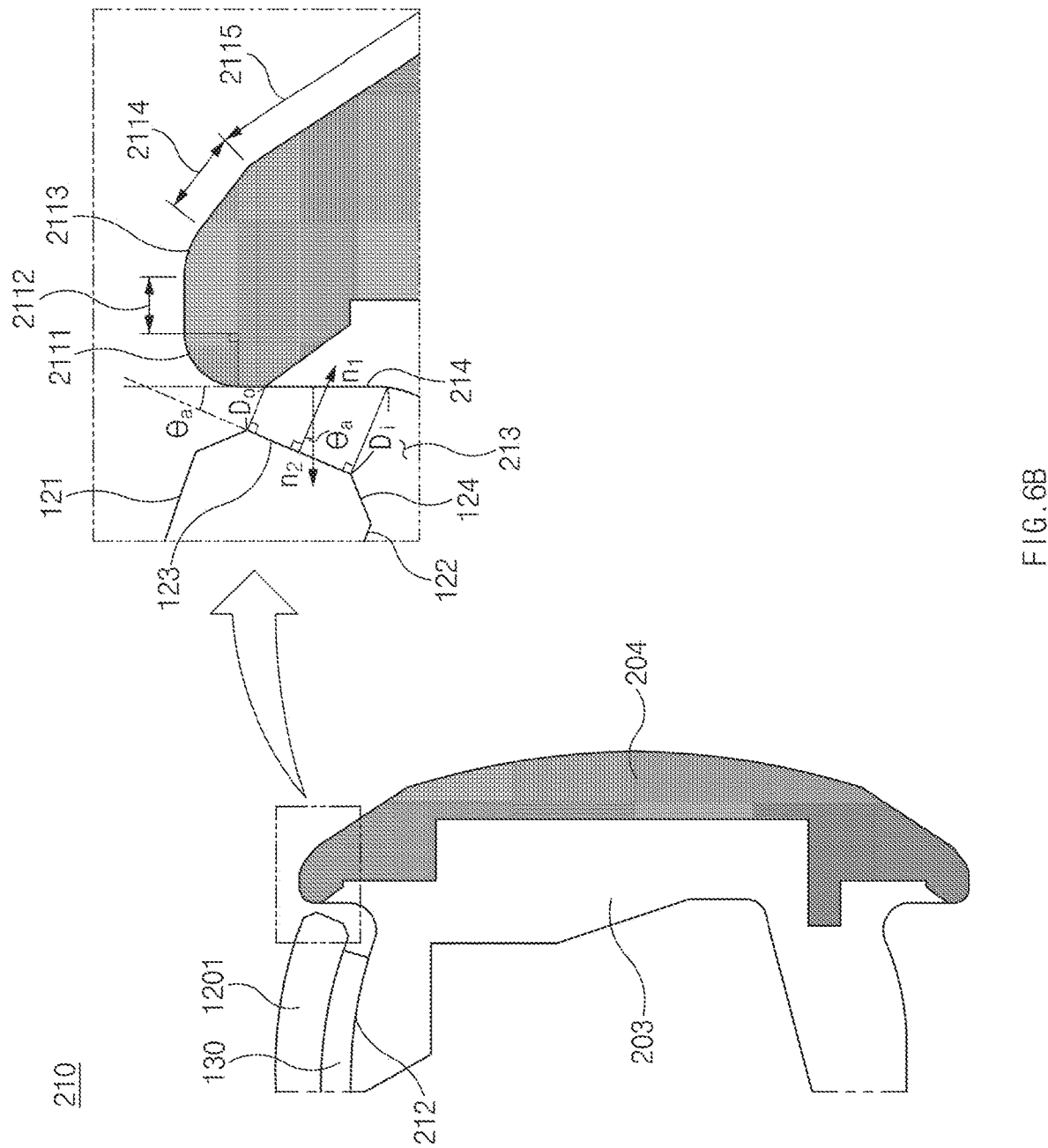
Figure 6C:
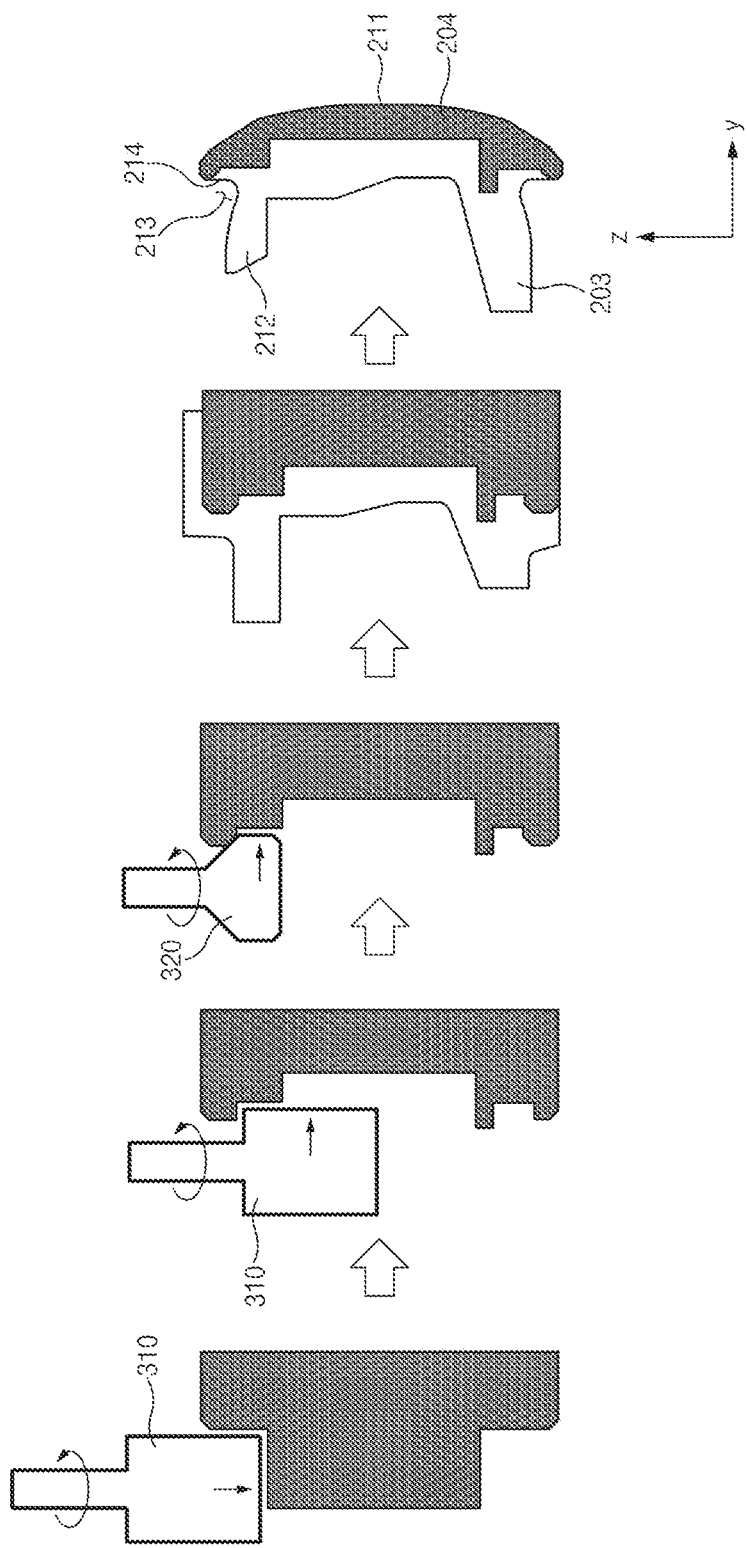

FIGS. 6A to 6C are views illustrating a first part of the side member of the electronic device, according to an embodiment. FIG. 6A is a sectional view taken along line A-A' of FIG. 5. FIG. 6A is a view illustrating the relationship among the first part of the side member, the first cover, and the display. FIG. 6A illustrates some of a process of manufacturing the first part of the side member.

In the description of the first part 210 of the side member 200, the height direction (or the first direction) is a direction of facing the upper portion (e.g., the direction of facing from the second cover 180 to the first cover 120 or the direction that the planar part 1204 of the first cover 120 faces), when viewed based on the drawings. The inward direction (or the second direction) of the electronic device 100 refers to a direction (e.g., a direction of facing the space between the first cover and the second cover from the side member) of facing the polymer part from the metal part. The outward direction (or the third direction) of the electronic device 100 refers to a direction (e.g., a direction of facing the side member from the inner space of the electronic device) of facing the metal part from the polymer part.

In an embodiment, the first part 210 of the side member 200 may include an outer surface 211, an inner surface 214 opposite to the outer surface 211, a support surface 212, and a recess 213 formed in the inner surface 214. The outer surface 211 of the first part 210 may include a curved area having a predetermined curvature and a planar area. The outer surface 211 of the first part 210 may substantially face the right side when viewed based on the drawings. The inner surface 214 of the first part 210 may be opposite the outer surface 211 and may extend inward of the electronic device 100. The inner surface 214 of the first part 210 and the outer surface 211 of the first part 210 may be connected with each other through a curved surface. The recess 213 may be formed in the inner surface 214 of the first part 210. The support surface 212 may extend inward of the electronic device 100 from the inner surface 214.

Referring to FIG. 6A, the first part 210 of the side member 200 may include a metal part 204 that includes a metal material, and a polymer part 203 coupled to the metal part 204, extending inward (the direction of facing the space between the first cover 120 and the second cover 180 in FIG. 3) of the electronic device 100, and including a polymer material. The polymer part 203 of the side member 200 may be injection-molded in the metal part 204.

In an embodiment, the outer surface 211 of the first part 210 of the side member 200 may be formed by the metal part 204. Meanwhile, at least a portion of the inner surface 214 of the first part 210 may be formed by the polymer part 203. The recess 213 formed in the inner surface 214 of the first part 210 may be formed by the polymer part 203. In addition, the support surface 212 of the first part, which extends inward of the electronic device from the inner surface 214 of the first part 210, may be formed by the polymer part 203.

Referring to FIG. 6A, the polymer part 203 and the metal part 204 may be coupled to each other through the surface contact therebetween. Accordingly, the coupling strength between the metal part 204 and the polymer part 203 may be increased as the contact surface is increased.

Referring to FIG. 6A, the metal part 204 and the polymer part 203 may be shape-coupled to (engaged with) each other. For example, one or more recesses 213 may be formed in the contact surface between the polymer part 203 and the metal part 204, and the polymer part 203 may be formed inside the recess 213. Accordingly, the contact area (e.g., the area of the inner surface of the recess 213) between the metal part 204 and the polymer part 203 may be increased such that the strong coupling strength is maintained.

According to an embodiment, the recess 213 formed in the metal part 204 may be recessed outward (e.g., the third direction) of the electronic device 100 from the contact surface with the metal part 204. Accordingly, the polymer part 203 and the contact surface between the polymer part 203 and the metal part 204 may not be exposed to the outside of the electronic device 100. When an external impact is applied to the electronic device 100, the polymer part 203 may not be directly impacted due to the metal part 204 surrounding the polymer part 203. In addition, referring to FIG. 6, the contact surface (e.g., the inner surface of the recess 213) between the metal part 204 and the polymer part 203 is surrounded by the metal part 204, thereby preventing the polymer part 203 from being separated from the metal part 204.

In an embodiment, the metal part 204 may include a contact surface with which the polymer part 203 makes contact. The first recess 221 and the second recess 223 may be formed in the contact surface. The first recess 221 may include a first part formed at the depth of 'D1' and a second part formed at the depth of 'D2'.

In an embodiment, the first recess 221 may include a first inner surface 2221, a second inner surface 2222 connected with the first inner surface 2221, a third inner surface 2223 connected with the second inner surface 2222, a fourth inner surface 2224 connected with the third inner surface 2223, a fifth inner surface 2225 connected with the fourth inner surface 2224, and a sixth inner surface 2226 connected with the fifth inner surface 2225.

In an embodiment, the first inner surface 2221 of the first recess 221 may extend inward (e.g., an outer direction or the third direction of the electronic device 100) of the metal part 204 from an area, which is formed by the metal part 204, of the inner surface 214 of the first part 210. The first inner surface 2221 of the first recess 221 may include an inclined surface extending in any direction between the fourth direction, which is opposite to the first direction, and the third direction. The second inner surface 2222 of the first recess 221 may be connected to the first inner surface 2221 of the first recess 221, may extend in the third direction, and may face the fourth direction. The second inner surface 2222 of the first recess 221 may face a portion of the sixth inner surface 2226 of the first recess 221. The third inner surface 2223 of the first recess 221 may be connected with the second inner surface 2222 of the first recess 221, may extend in the fourth direction, and may face the second direction (e.g., inward of the electronic device 100). The fourth inner surface 2224 of the first recess 221 may be connected with the third inner surface 2223 of the first recess 221, and may extend in the third direction from the third inner surface 2223. The fourth inner surface 2224 may face the fourth direction. The fourth inner surface 2224 of the first recess 221 may face a portion of the sixth inner surface 2226 of the first recess 221. The fifth inner surface 2225 of the first recess 221 may be connected with the fourth inner surface 2224 and may extend in the fourth direction. The fifth inner surface 2225 of the first recess 221 may face the second direction (e.g., inward of the electronic device 100). The sixth inner surface 2226 of the first recess 221 may be connected with the fifth inner surface 2225 of the first recess 221 and may face the first inner surface 2221 of the first recess 221, the second inner surface 2222 of the first recess 221, and the fourth inner surface 2224 of the first recess 221.

According to various embodiments, the third inner surface 2223 of the first recess 221 may be connected with the first inner surface 2221 of the first recess 221 while forming a step 2261. According to various embodiments, the fifth inner surface 2225 of the first recess 221 may be connected with the third inner surface 2223 of the first recess 221 while forming the step 2262.

In an embodiment, the first recess 221 may be formed in the contact surface of the metal part 204 making contact with the polymer part 203. The first recess 221 may include a bottom surface (e.g., the fifth inner surface 2225) facing the inside (e.g., the space between the first cover 120 and the second cover 180) of the electronic device 100, first inner sidewalls (e.g., including the first inner surface 2221, the second inner surface 2222, the third inner surface 2223, and the fourth inner surface 2224) formed at opposite ends of the bottom surface, and second inner sidewalls (e.g., the sixth inner surface 2226) facing the first inner sidewalls. The first inner sidewall may be connected with an area, which is formed by the metal part 204, of the inner surface 214 of the first part 210. The first inner sidewall may include at least one or more steps 2261 and 2262 and an inclined surface (e.g., the first inner surface 2221). The inclined surface included in the first inner sidewall may face inward (e.g., the second direction) of the electronic device 100. Accordingly, the polymer part 203 formed inside the recess 213 is not exposed at least to the outside of the electronic device 100 and may be protected by the metal part 204. When the impact is applied to the outside of the electronic device 100, the polymer part 203 may be prevented from being separated from the metal part 204.

In an embodiment, the second recess 223 may be formed at a position separated from the first recess 221. A metal protrusion 225 may be formed between the second recess 223 and the first recess 221. The second recess 223 may include a first inner surface 2241 extending from an area formed by the metal part 204, a second inner surface 2242 connected with the first inner surface 2241, a third inner surface 2243 connected with the second inner surface 2242, and a fourth inner surface 2244 connected to the third inner surface 2243.

In an embodiment, the first inner surface 2241 of the second recess 223 may be formed obliquely. The first inner surface 2241 of the second recess 223 may include an inclined surface extending in any direction between the first direction and the third direction, when viewed from FIG. 6A. The first inner surface 2241 of the second recess 223 may include an inclined surface facing inward of the electronic device 100 (e.g., the direction of facing the space between the first cover 120 and the second cover 180). The second inner surface 2242 of the second recess 223 may be connected with the first inner surface 2241 of the second recess 223, may extend in the first direction, and may face the first direction. The third inner surface 2243 of the second recess 223 may face inward of the electronic device 100 (e.g., the second direction or toward the space between the first cover 120 and the second cover 180). The fourth inner surface 2244 of the second recess 223 may face the first inner surface 2241 of the second recess 223 and the second inner surface 2242 of the second recess 223.

In an embodiment, the second recess 223 may be formed in the contact surface of the metal part 204 making contact with the polymer part 203. The second recess 223 may include a bottom surface (e.g., the third inner surface 2243) facing the inside (e.g., the space between the first cover 120 and the second cover 180) of the electronic device 100, first inner sidewalls (e.g., the first inner surface 2241 and the second inner surface 2242) formed at opposite ends of the bottom surface, and second inner sidewalls (e.g., the fourth inner surface 2244) facing the first inner sidewalls. The first inner sidewall and the second inner sidewall may be connected with an area, which is formed by the metal part 204, of the inner surface 214 of the first part 210. The first inner sidewall may include at least one or more steps 2263 and an inclined surface (e.g., the first inner surface 2241). The inclined surface included in the first inner sidewall may face at least inward of the electronic device 100. Accordingly, the polymer part 203 formed inside the recess 213 is not exposed at least to the outside of the electronic device 100 and may be protected by the metal part 204. When the impact is applied to the outside of the electronic device 100, the polymer part 203 may be prevented from being separated from the metal part 204.

Referring to FIG. 6A, the first curved part 1201 of the first cover 120 includes a first surface 121 forming the first surface 110A of the electronic device 100, a second surface 122 facing the display 130, and an end surface 123 formed at the end of the first curved part 1201. The end surface 123 may be interposed between the first surface 121 and the second surface 122. Meanwhile, the display 130 may be disposed below the first cover 120, and a portion (e.g., the edge) of the display 130 may be supported by the polymer part 203 included in the first part 210 of the side member 200. The area, which corresponds to the first curved part 1201 of the first cover 120, of the display 130 may be provided in the form of a curved surface corresponding to the first curved part 1201 of the first cover 120.

Referring to FIG. 6A, the side member 200 may include the inner surface 214 facing the end surface 123 of the first cover 120, the recess 213 formed in the inner surface 214, the first curved part 1201 of the first cover 120 facing the recess 213, and a support surface 212 extending inward of the electronic device 100 from the recess 213 to support the display 130. At least a portion of the inner surface 214 may include a metal material. At least some of the recess 213 and the support surface 212 may include a polymer material. The support surface 212 is formed by the polymer part 203 having the strength weaker than the strength of the metal part 204, thereby absorbing a portion of external impact applied to the display 130. Accordingly, the display 130 may be prevented from being broken.

According to various embodiments, an inclined fillet and a chamfer 124 may be formed between the end surface 123 of the first cover 120 and the first surface 121 of the first cover 120 and between the end surface 123 of the first cover 120 and the second surface 122 of the first cover 120.

In an embodiment, the end surface 123 of the first cover 120 may be spaced apart from the inner surface 214 of the side member 200 by a specific distance. In an embodiment, the end surface 123 of the first cover 120 and the inner surface 214 of the side member 200 may be arranged to form a specific angle therebetween.

Referring to FIG. 6A, the distance Di, which is illustrated, may refer to a length of a line extending to the inner surface 214 of the side member 200 in a direction of a normal vector to the end surface 123 from the first area of the end surface 123. The distance Do may refer to the length of the line extending to the inner surface 214 of the side member 200 in the normal vector to the end surface 123 from the second area of the end surface 123. According to an embodiment, the distance Di may be greater than the distance Do. In various embodiments, the distance Do may be in the range of 0.05 mm to 0.15 mm Preferably, the distance Do may be 0.10 mm.

In various embodiments, when compared to the second area, which is adjacent to the first surface 121 of the first cover 120, of the end surface 123 of the first cover 120, the first area, which is adjacent to the second surface 122 of the first cover 120, of the end surface 123 of the first cover 120 may form a longer distance to the inner surface 214 of the first part 210. Alternatively, the first area of the end surface 123 may be closer to the support surface 212 when compared to the second area of the end surface 123. In an embodiment, the distance between the first area of the end surface 123 and the inner surface 214 of the side member 200 may be longer than the distance between the second area of the end surface 123 and the inner surface 214 of the side member 200.

In an embodiment, the side member 200 and the first cover 120 may form a housing structure (e.g., the housing 110 of FIG. 1). In this case, a specific distance may be formed between the end surface 123 of the first cover 120 and the inner surface 214 of the side member 200. The distance may be reduced toward the outside of the housing structure from the inside of the housing structure.

Referring to FIG. 6B, FIG. 6B is a view illustrating the relationship among the first part of the side member, the first cover, and the display.

In an embodiment, the normal vector n1 to the end surface 123 and the normal vector n2 to the inner surface 214 may form an angle of $\theta_a$. In an embodiment, $\theta_a$ may refer to an angle formed between the extension direction of the end surface 123 and the extension direction of the inner surface 214. In various embodiments, $\theta_a$ may be in the range of 20° to 25°. Preferably, $\theta_a$ may be 23°.

In an embodiment, the outer surface 211 of the side member 200 may include a curved area (e.g., the first curved area 2111) connected with the inner surface 214 of the side member 200, and one or more planar areas connected with the curved area and facing in mutually different directions.

The outer surface 211 of the first part 210 of the side member 200 may include a first curved area 2111 connected with the inner surface 214 of the first part 210 of the side member 200, a first planar area 2112 connected with the curved area 2111, a second curved area 2113 connected with the first planar area 2112, a second planar area 2114 connected with the second curved area 2113, And a third planar area 2115 connected to the second planar area 2114.

In various embodiments, the first curved area 2111 may have a radius of curvature R1. The first planar area 2112 may be formed in a direction parallel to the first direction of the electronic device 100 (e.g., the direction that the planar part 1204 of the first cover 120 faces). The second curved area 2113 may have a radius of curvature R greater than the radius of curvature R1. In other words, the second curved area 2113 may have a curvature smaller than a curvature of the first curved area 2111. For example, the radius of curvature R1 may be 0.15 mm and the radius of curvature R2 may be 0.35 mm. The second planar area 2114 and the third planar area 2115 are formed to face any direction between the first direction (e.g., the height direction) and the third direction (e.g., the outward direction of the electronic device). In this case, the direction that the second planar area 2114 faces may be closer to the first direction than the direction that the third planar area 2115 faces. In other words, the angle between the direction that the second planar area 2114 faces and the first direction may be smaller than the angle between the direction that the third planar area 2115 faces and the first direction. The second planar area 2114 and the third planar area 2115 may be arranged to form a specific angle, for example, the specific angle may be 20 degrees Referring to FIG. 6A, the inclined surfaces (e.g., the first inner surface 2221 of the first recess 221, and the first inner surface 2241 of the second recess 223) included in the metal part 204 of the first part 210 of the side member 200 may be formed through at least two cutting processes.

First, at least a part of the recess 213 may be formed by moving the first tool 310 in the x-axis direction and/or the z-axis direction. In this case, the first tool 310 may be formed in the shape of a cylinder having a bottom surface provided in the form of a circular planar surface. Thereafter, an inclined surface (e.g., the inner sidewall of the first recess 221) may be formed at the end of the recess 213 by moving a second tool 320 in the x-axis direction. In this case, the second tool 320 may be a tool coupled to the rotational axis and including a first circular surface having a first diameter and a second circular surface having a second diameter greater than the first diameter.

Referring to FIG. 6C, FIG. 6C illustrates some of a process of manufacturing the first part of the side member.

In a typical computer numerical control (CNC) process, a tool (e.g., a ball tool) having a protruding bottom surface (e.g., cutting surface) is used. When the recess is machined by using the ball tool, cutting is more performed from a reference surface (e.g., a surface formed along a tool path), so the strength may be weakened in the metal part 204 of the side member 200.

Accordingly, in an embodiment, the metal part 204 of the side member 200 of the electronic device 100 may be cut and formed by a flat tool (e.g., the first tool 310 and the second tool 320) having a bottom surface (cutting surface) provided in the planar form as illustrated in drawings.

In an embodiment, only a one-directional load may be applied to the second tool 320 in the second cutting process to form the inclined surface. To this end, the first tool 310 may more move in the z-axis direction in the first cutting process. The recess 213 formed by the first tool 310 has a depth longer than the length of the second tool 320 in the z-axis direction, so the z-axis load is not applied to the second tool 320 in the second cutting process. Accordingly, the second tool 320 may be prevented from being broken.

After the undercutting process for the metal part 204 using the first tool 310 and the second tool 320 is performed as described above, the polymer part 203 may be injection-molded. After the polymer part 203 is injection-molded, some of the polymer part 203 and the metal part 204 may be cut. The outer surface 211 and the inner surface 214 may be formed through cutting. The inner surface 214 may be formed therein with a recess 213 in which the first curved part 1201 of the first cover 120 is received. In addition, the support surface 212 having a curvature corresponding to the curvature of the edge of the display 130 may be formed.

Figure 7A:
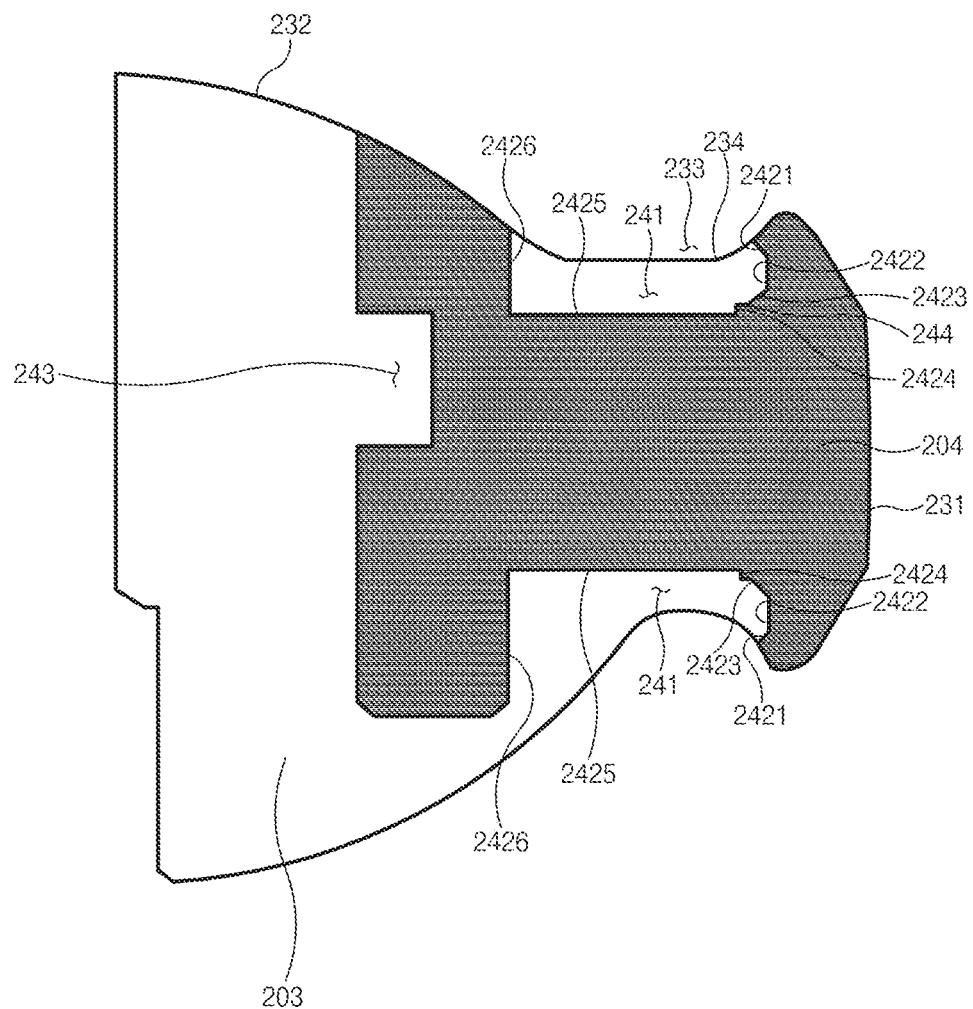
FIGS. 7A, 7B, and 7C are views illustrating a second part of the side member of an electronic device, according to various embodiments of the disclosure.
Figure 7B:
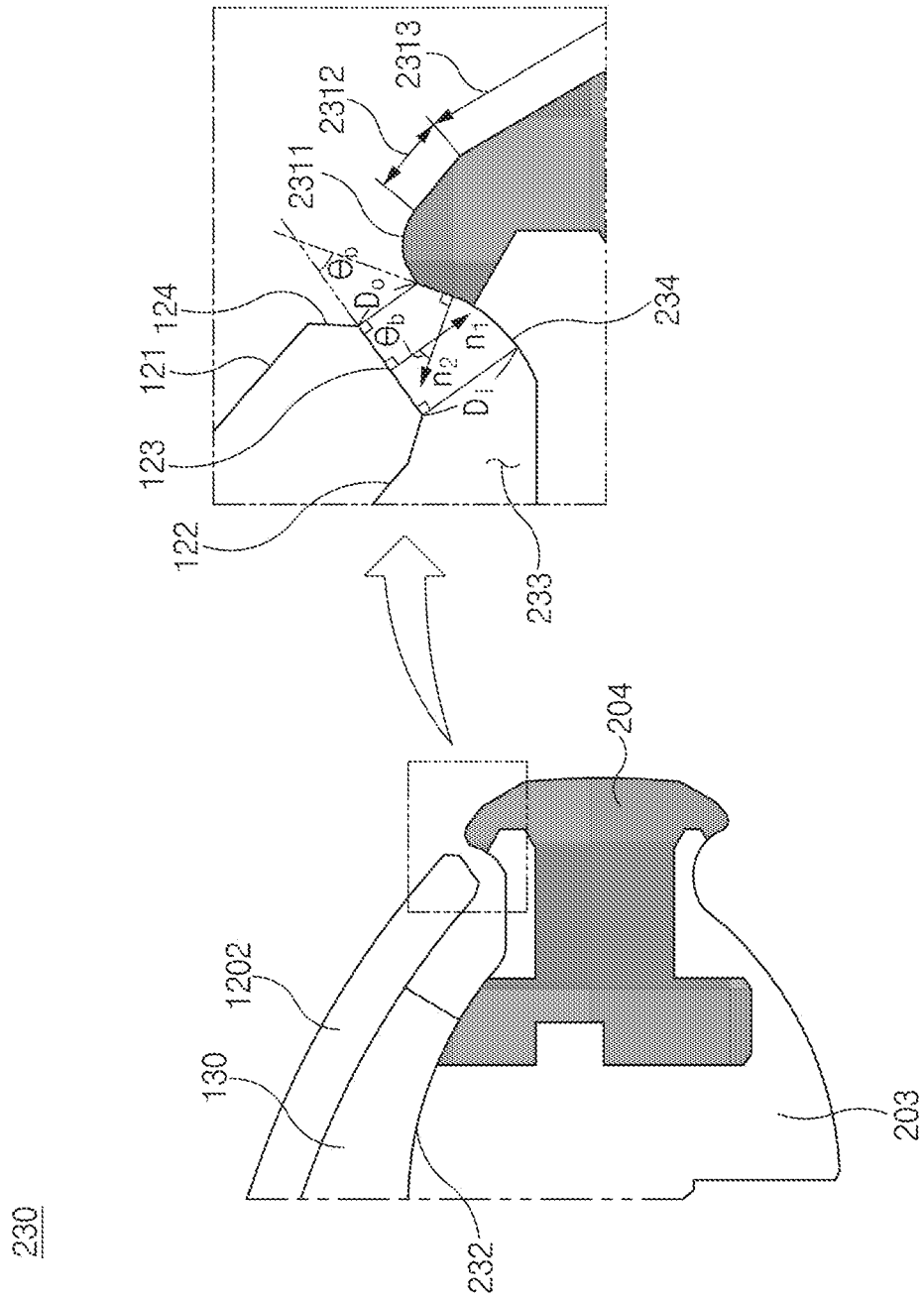
Figure 7C:
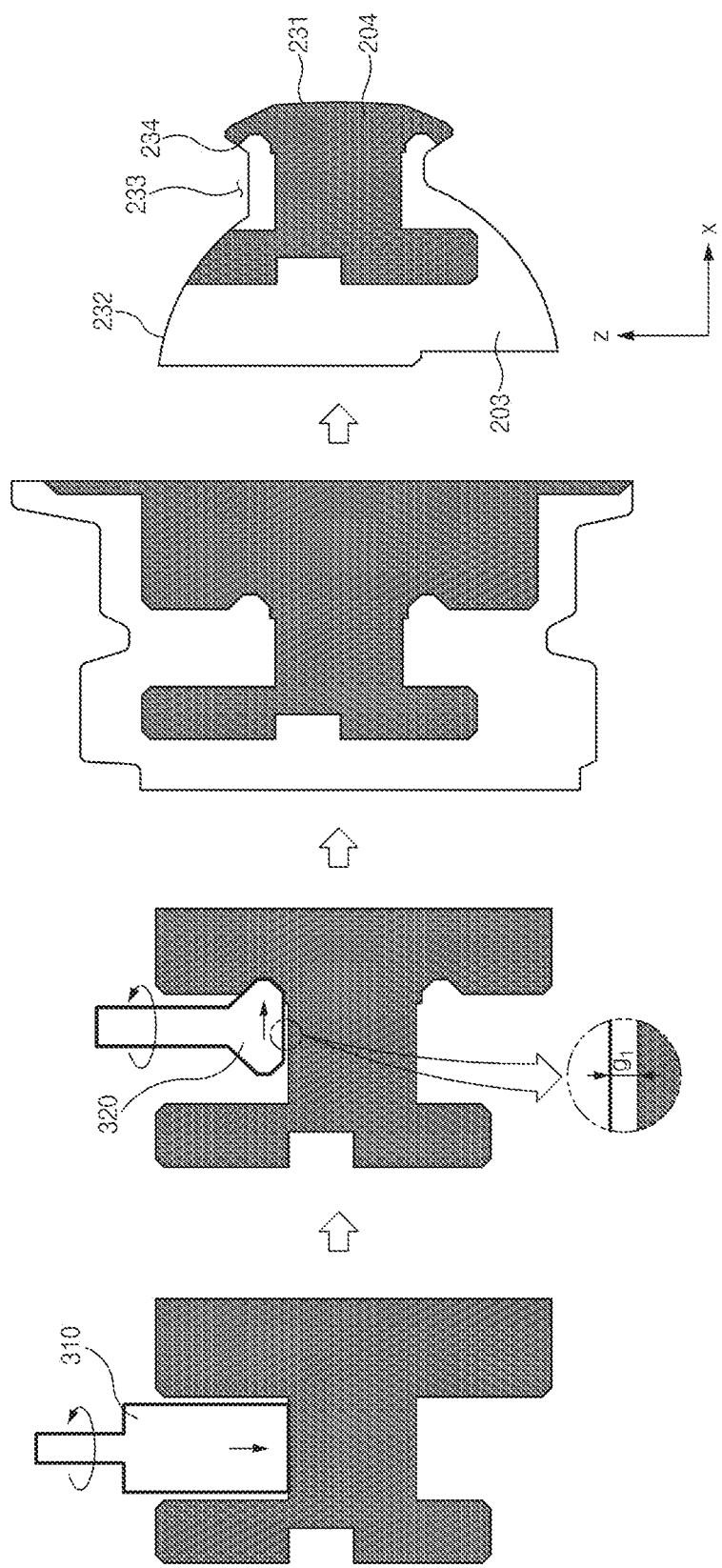

FIGS. 7A to 7C are views illustrating a second part of the side member of the electronic device, according to various embodiments of the disclosure. FIG. 7A is a sectional view taken along line C-C' of FIG. 5. FIG. 7B is a view illustrating the relationship among the second part of the side member, the second curved part of the first cover, and the display. FIG. 7C illustrates some of a process of manufacturing the second part of the side member.

In the description of the second part 230 of the side member 200, the height direction (or the first direction) is a direction of facing the upper portion (e.g., the direction of facing from the second cover to the first cover, when viewed based on the drawings. The inward direction (or the second direction) of the electronic device 100 refers to a direction (e.g., a direction of facing the space between the first cover and the second cover from the side member) of facing the polymer part from the metal part. The outward direction (or the third direction) of the electronic device 100 refers to a direction (e.g., a direction of facing the side member from the inner space of the electronic device) of facing the metal part from the polymer part.

In an embodiment, the second part 230 of the side member 200 may include an outer surface 231, an inner surface 234 opposite to the outer surface 231, a support surface 232 formed on the inner surface 234, and a recess 233 formed in the support surface 232. The outer surface 231 of the second part 230 may include a curved area having a specific curvature and a planar area connected with the curved area. The outer surface 231 of the second part 230 may substantially face the right side when viewed based on the drawings. The inner surface 234 of the second part 230 may be opposite the outer surface 231 and may extend inward (e.g., the second direction) of the electronic device 100. The inner surface 234 of the second part 230 and the outer surface 231 of the second part 230 may be connected with each other through a curved surface. The recess 233 may be formed in the inner surface 234 of the second part 230. The support surface 232 may extend inward (e.g., the second direction) of the electronic device 100 from the inner surface 234.

Referring to FIG. 7A, the second part 230 of the side member 200 may include a metal part 204 that includes a metal material, and a polymer part 203 coupled to the metal part 204, extending inward (e.g., the second direction, or the direction of facing the space between the first cover 120 and the second cover 180) of the electronic device 100, and including a polymer material. The polymer part 203 of the side member 200 may be injection-molded in the metal part 204.

In an embodiment, the outer surface 231 of the second part 230 of the side member 200 may be formed by the metal part 204. At least a portion of the inner surface 234 of the second part 230 may be formed by the polymer part 203. The recess 233 formed in the inner surface 234 of the second part 230 may be formed by the polymer part 203. At least a portion of the inner surface 234 of the second part 230 may be formed by the polymer part 203.

Referring to FIG. 7A, the polymer part 203 and the metal part 204 may be coupled to each other through the surface contact therebetween. Accordingly, the coupling strength between the metal part 204 and the polymer part 203 may be increased as the contact surface is increased.

Referring to FIG. 7A, the metal part 204 and the polymer part 203 may be shape-coupled to (engaged with) each other. For example, one or more recesses 233 may be formed in the contact surface between the polymer part 203 and the metal part 204, and the polymer part 203 may be formed inside the recess 233. Accordingly, the contact area (e.g., the area of the inner surface of the recess 233) between the metal part 204 and the polymer part 203 may be increased such that the strong coupling strength is maintained.

In an embodiment, the recess 233 formed in the metal part 204 may be recessed outward (e.g., the x-axis direction) of the electronic device 100 from the contact surface with the metal part 204. Accordingly, the polymer part 203 and the contact surface between the polymer part 203 and the metal part 204 may not be exposed to the outside of the electronic device 100. When an external impact is applied to the electronic device 100, the polymer part 203 may not be directly impacted due to the metal part 204 surrounding the polymer part 203. In addition, referring to FIG. 7A, the contact surface (e.g., the inner surface of the first recess 241) between the metal part 204 and the polymer part 203 is surrounded by the metal part 204, thereby preventing the polymer part 203 from being separated from the metal part 204.

In an embodiment, the metal part 204 may include a contact surface with which the polymer part 203 makes contact. The first recess 241 and the second recess 243 may be formed in the contact surface.

In an embodiment, the first recess 241 may include a first inner surface 2421 extending the inner surface 234 of the second part 230, a second inner surface 2422 connected with the first inner surface 2421, a third inner surface 2423 connected with the second inner surface 2422, a fourth inner side surface 2424 connected with the third inner surface 2423, a fifth inner surface 2425 connected with the fourth inner surface 2424, and a sixth inner surface 2426 connected with the fifth inner surface 2425.

In an embodiment, the first inner surface 2421 may extend inward of the metal part 204 from an area, which is formed by the metal part 204, of the inner surface 234 of the second part 230. The second inner surface 2422 may extend in the fourth direction from the first inner surface 2421 while facing inward (e.g., the second direction) of the electronic device 100. The first inner surface 2421 and the third inner surface 2423 may be formed at both ends of the second inner surface 2422, and may face each other. The first inner surface 2421 and the third inner surface 2423 may include inclined surfaces having a gap therebetween increasing inward (e.g., the second direction) of the electronic device 100. Any one of the first inner surface 2421 and the third inner surface 2423 may face any direction between the second direction and the first direction and a remaining one of the first inner surface 2421 and the third inner surface 2423 may face any direction between the second direction and the fourth direction have. The first inner surface 2421 and the third inner surface 2423 may include inclined surfaces that are inclined to face each other at a specific angle.

The fourth inner surface 2424 may face the sixth inner surface 2426 and may face inward (e.g., the second direction) of the electronic device 100. The fifth inner surface 2425 may face the first direction. The fourth inner surface 2424 and the sixth inner surface 2426 may be formed at both ends of the fifth inner surface 2425. The fourth inner surface 2424 and the sixth inner surface 2426 may face each other.

In various embodiments, the third inner surface 2423 and the fifth inner surface 2425 of the first recess 241 may be connected with each other while making the step difference therebetween. A stepped surface 244 may be formed between the third inner surface 2423 and the fourth inner surface 2424.

In an embodiment, the first recess 241 may be formed in the contact surface of the metal part 204 making contact with the polymer part 203. The first recess 241 includes a bottom surface (e.g., the fifth inner surface 2425) facing the first direction, a first inner sidewall (e.g., the sixth inner surface 2426) formed at both ends of the bottom surface, and a second inner sidewall (e.g., the first inner surface 2421, the second inner surface 2422, the third inner surface 2423, and the fourth inner surface 2424) facing the first inner sidewall. The first inner sidewall may be formed closer to the inside of the electronic device 100 than the second inner sidewall.

The second inner sidewall may have an additional recess (e.g., defined by the first inner surface 2421, the second inner surface 2422, and the third inner surface 2423) formed outward of the electronic device 100. The additional recess may include a bottom surface, third inner sidewalls (e.g., first inner surfaces 2421) formed at opposite ends of the bottom surface, and fourth inner sidewalls (e.g., the third inner surface 2423) facing the third inner sidewalls. The third inner sidewall may be connected with an area, which is formed by the metal part 204, of the inner surface 234 of the second part 230. The third inner sidewall may include an inclined surface (e.g., the first inner surface 2421). The inclined surface included in the third inner sidewall may face at least inward of the electronic device 100. Accordingly, the polymer part 203 formed inside the recess is not exposed to the outside of the electronic device 100 due to the metal part 204 and/or the first cover 120, and may be protected by the metal part 204. In addition, the contact surface between the polymer part 203 and the metal part 204 is covered by the metal part 204, thereby preventing the polymer part 203 from being separated from the metal part 204 when an impact is applied to an outer portion of the electronic device 100.

According to an embodiment, the second recess 243, which is recessed in the third direction, may be additionally formed in the metal part 204, and the polymer part 203 may be formed inside the second recess 243.

Referring to FIG. 7B, the second curved part 1202 of the first cover 120 includes a first surface 121 forming the first surface 110A of the electronic device 100, a second surface 122 facing the display 130, and an end surface 123 formed at the end of the second curved part 1202. The end surface 123 may be interposed between the first surface 121 and the second surface 122. A fillet and a chamfer 124 may be formed between the end surface 123 and the first surface 121, and between the end surface 123 and the second surface 122, respectively.

Meanwhile, the display 130 may be disposed below the first cover 120, and a portion (e.g., the edge) of the display 130 may be supported by the polymer part 203 of the side member 200. One area, which corresponds to the second curved part 1202 of the first cover 120, of the display 130 may be provided in the form of a curved surface corresponding to the second curved part 1202 of the first cover 120.

In the illustrated embodiment, the side member 200 may include the inner surface 234 facing the end surface 123 of the first cover 120, the recess 233 formed in the inner surface 234, the second curved surface part 1202 of the first cover 120 facing the recess 233, and the support surface 232 extending inward of the electronic device 100 from the recess 233 to support the display 130. At least a portion of the inner surface 234 may include a metal material. At least some of the recess 233 and the support surface 232 may include a polymer material. The support surface 232 includes the polymer part 203 having the strength weaker than the strength of the metal part 204, thereby absorbing a portion of external impact applied to the display 130. Accordingly, the display 130 may be prevented from being broken.

In an embodiment, the end surface 123 of the first cover 120 may be spaced apart from the inner surface 234 of the side member 200 by a specific distance. In an embodiment, the end surface 123 of the first cover 120 and the inner surface 234 of the side member 200 may be arranged to form a specific angle therebetween.

Referring to FIG. 7B, the distance Di, which is illustrated, may refer to a length of a line extending to the inner surface 234 of the side member 200 in a direction of a normal vector to the end surface 123 from the first area of the end surface 123. The distance Do may refer to the length of the line extending to the inner surface 234 of the side member 200 in the normal vector to the end surface 123 from the second area of the end surface 123. According to an embodiment, the distance Di may be greater than the distance Do. In various embodiments, the distance Do may be in the range of 0.02 mm to 0.12 mm Preferably, Do may be 0.07 mm.

In various embodiments, the first area of the end surface 123 may be positioned at an inner part of the electronic device 100, rather than the second area of the end surface 123. Alternatively, the first area of the end surface 123 may be closer to the support surface 232 when compared to the second area of the end surface 123. In an embodiment, the distance between the first area of the end surface 123 and the inner surface 234 of the side member 200 may be longer than the distance between the second area of the end surface 123 and the inner surface 234 of the side member 200.

In an embodiment, the side member 200 and the first cover 120 may form a housing structure. In this case, a specific distance may be formed between the end surface 123 of the first cover 120 and the inner surface 234 of the side member 200. The distance may be reduced toward the outside of the housing structure from the inside of the housing structure.

In an embodiment, the normal vector "n1" to the end surface 123 and the normal vector "n2" to the inner surface 234 may form an angle of "$\theta_b$". In an embodiment, the angle of "$\theta_b$" may refer to an angle formed between the extension direction of the end surface 123 and the extension direction of the inner surface 234. In various embodiments, the angle of "$\theta_b$" may be in the range of 25° to 30°. Preferably, the angle of "$\theta_b$" may be 27°.

In an embodiment, the outer surface 231 of the side member 200 may include a curved area (e.g., the first curved area 2111) connected with the inner surface 234 of the side member 200, and one or more planar areas connected with the curved area and facing in mutually different directions.

The outer surface 231 of the second part 230 of the side member 200 may include a first curved area 2311 connected with the inner surface 234 of the second part 230 of the side member 200, a first planar area 2312 connected with the first curved area 2311, and a second planar area 2323 connected with the first planar area 2312.

In various embodiments, the first curved area 2311 may have a radius of curvature R1. For example, the radius of curvature R1 may be 0.15 mm. The first planar area 2312 and the second planar area 2313 are formed to face any direction between the first direction and the second direction. In this case, the direction that the first planar area 2312 faces may be closer to the first direction, rather than the direction that the second planar area 2313 faces. In other words, the angle between the direction that the first planar area 2312 faces and the first direction may be smaller than the angle between the direction that the second planar area 2313 faces and the first direction. The first planar area 2312 and the second planar area 2313 may be arranged to form a specific angle, for example, the specific angle may be 20 degrees Referring to FIG. 7C, the inclined surfaces (e.g., the first inner surface 2421 and the third inner surface 2423 of the first recess 241) included in the metal part 204 of the second part 230 of the side member 200 may be formed through at least two cutting processes.

First, a first tool 310 moves in the first direction, at least a portion of the recess may be formed. Thereafter, as the second tool 320 moves in the third direction, inclined surfaces may be formed at both ends of the bottom surface (a surface, which faces a direction (e.g., the second direction) opposite to a molding direction, of the inner surfaces of the recess) of the recess. In this case, the first tool 310 may be formed in the shape of a cylinder having a bottom surface provided in the form of a circular planar surface. The second tool 320 may be a tool coupled to the rotational axis and including a first circular surface having a first diameter and a second circular surface having a second diameter greater than the first diameter.

In a typical CNC process, a tool (e.g., a ball tool) having a protruding bottom surface (e.g., cutting surface) is used. When the recess is machined by using the ball tool, cutting is more performed from a reference surface (e.g., a surface formed along a tool path), so the strength may be weakened in the metal part 204 of the side member 200.

Accordingly, in an embodiment, the metal part 204 of the side member 200 of the electronic device 100 may be cut and formed by a flat tool (e.g., the first tool 310 and the second tool 320) having a bottom surface (cutting surface) provided in the planar form as illustrated in drawings.

In an embodiment, only a one-directional load may be applied to the second tool 320 in the second cutting process to form the inclined surface. To this end, the second tool 320 may form an additional recess as the second tool 320 moves in the state that the second tool 320 is spaced apart from the bottom surface of the recess formed through the first cutting process by a specific distance g1. In the second cutting process, the load may not be applied to the second tool 320 in the first direction. Accordingly, the second tool 320 may be prevented from being broken.

Figure 8A:
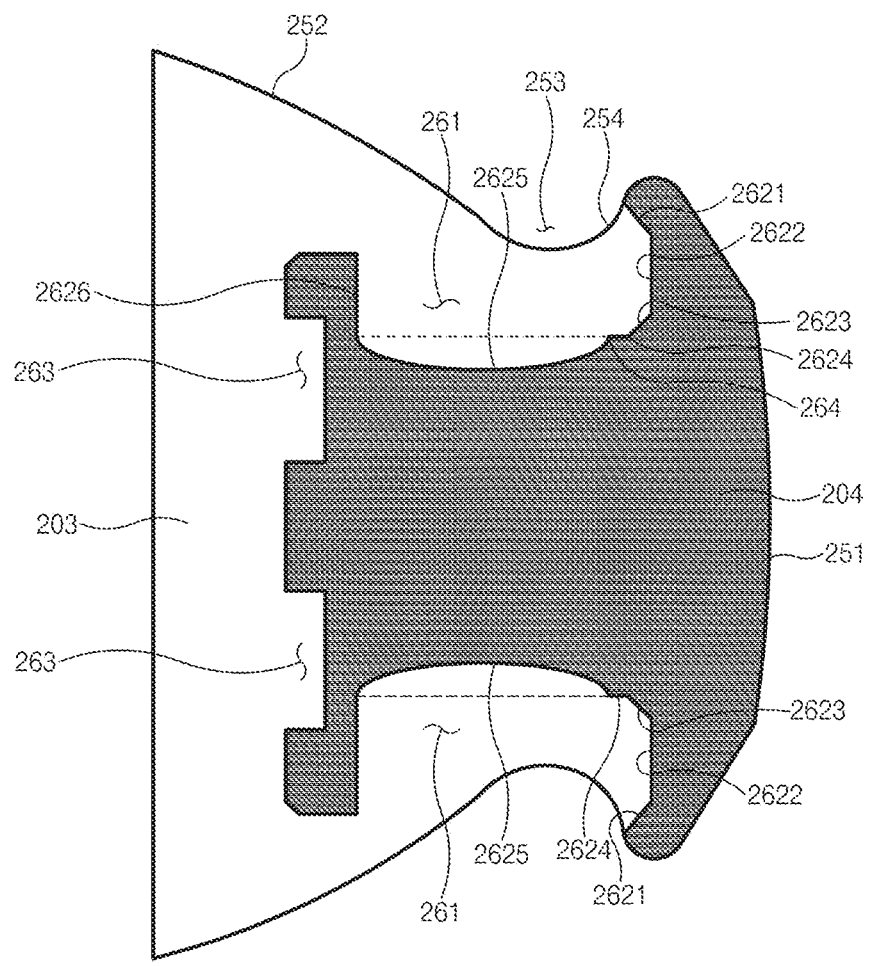
FIGS. 8A, 8B, and 8C are views illustrating a corner part of the side member of an electronic device, according to various embodiments of the disclosure.
Figure 8B:
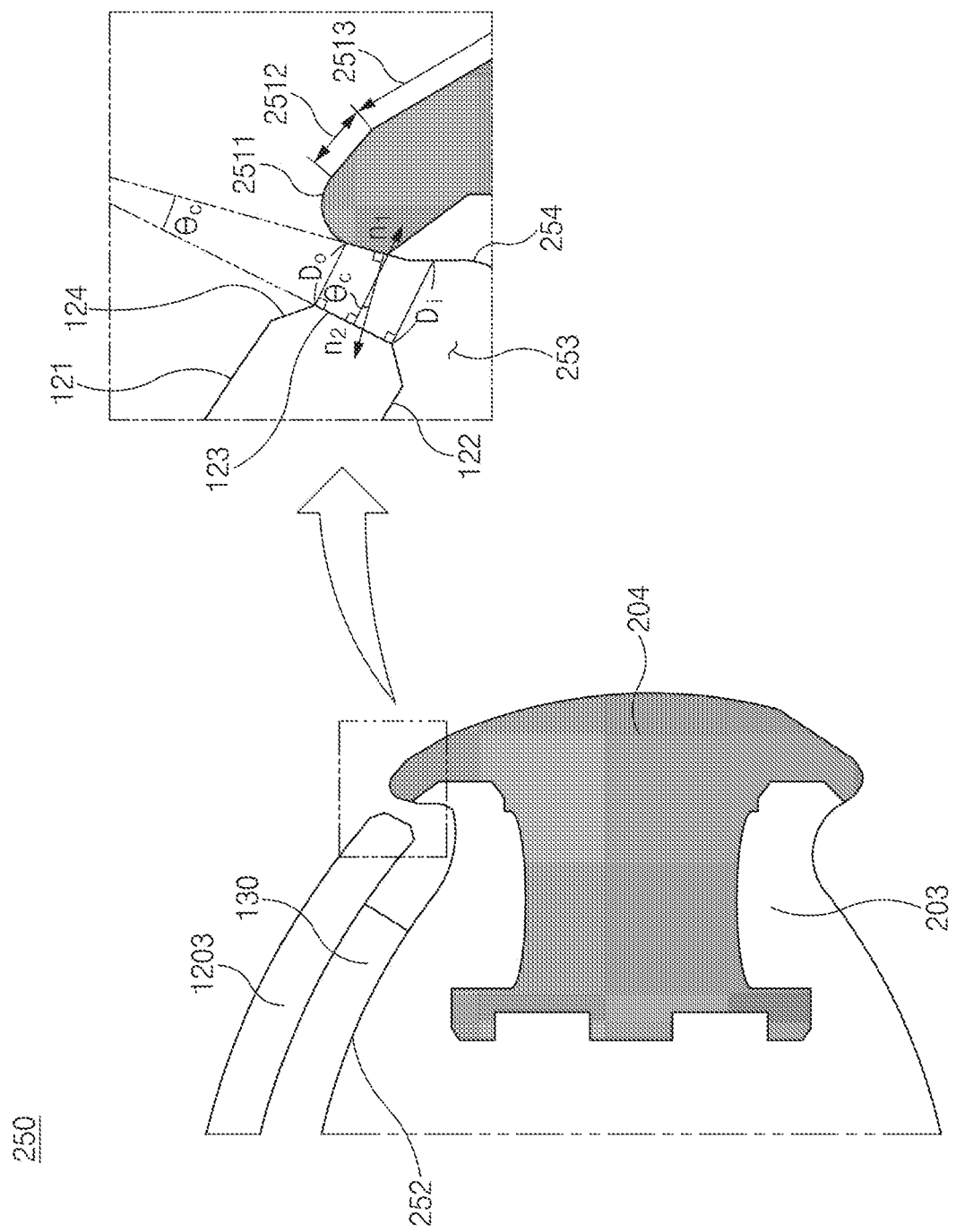
Figure 8C:
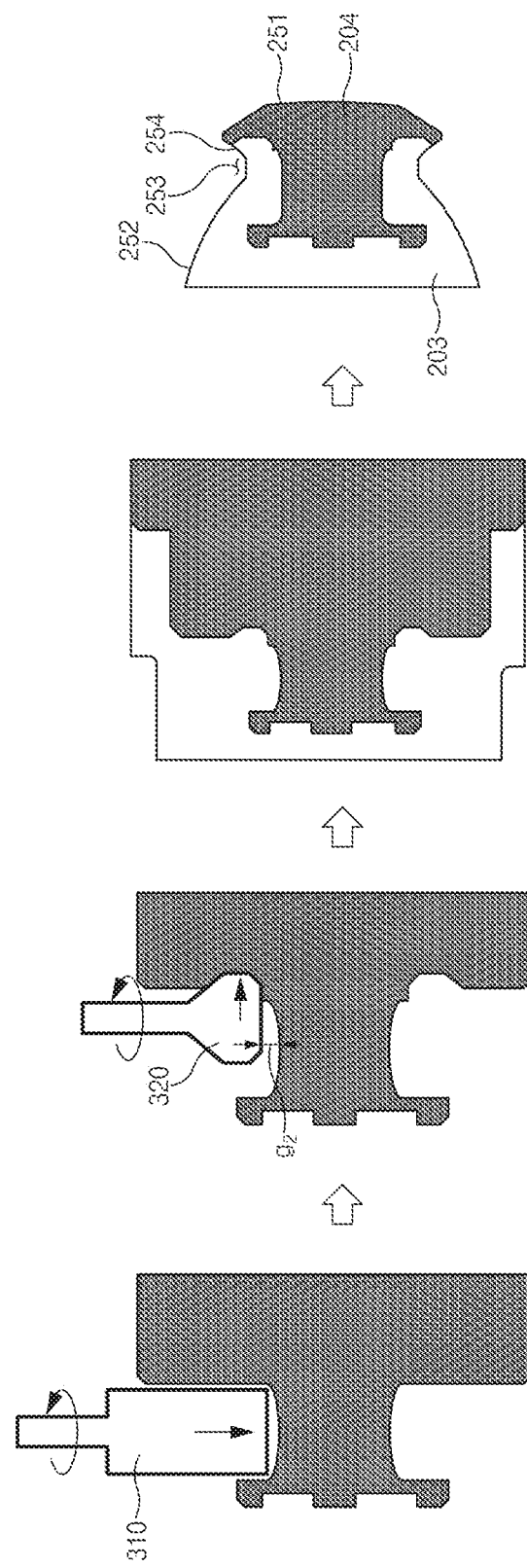

After the undercutting process for the metal part 204 using the first tool 310 and the second tool 320 is performed as described above, the polymer part 203 may be injection-molded. After the polymer part 203 is injection-molded, some of the polymer part 203 and the metal part 204 may be cut. The outer surface 231 and the inner surface 234 may be formed through cutting. The inner surface 234 may be formed therein with a recess 233 in which the second curved part 1202 of the first cover 120 is received. In addition, the support surface 232 having a curvature corresponding to the curvature of the edge of the display 130 may be formed FIGS. 8A to 8C are views illustrating a corner part of the side member of the electronic device, according to various embodiments of the disclosure. FIG. 8A is a sectional view taken along line B-B' of FIG. 4. FIG. 8B is a view illustrating the relationship among the corner part of the side member, the corner curved part of the first cover, and the display. FIG. 8C illustrates some of a process of manufacturing the corner part of the side member.

In the description of the second part 250 of the side member 200, the height direction (or the first direction) is a direction of facing the upper portion (e.g., the direction of facing from the second cover to the first cover, when viewed based on the drawings. The inward direction (or the second direction) of the electronic device 100 refers to a direction (e.g., a direction of facing the space between the first cover and the second cover from the side member) of facing the polymer part from the metal part. The outward direction (or the third direction) of the electronic device 100 refers to a direction (e.g., a direction of facing the side member from the inner space of the electronic device) of facing the metal part from the polymer part.

In an embodiment, the corner part 250 of the side member 200 may include an outer surface 251, an inner surface 254 opposite to the outer surface 251, a support surface 252 formed on the inner surface 254, and a recess 253 formed in the support surface 252.

The outer surface 251 of the corner part 250 may include a curved area having a predetermined curvature and a planar area. The outer surface 251 of the corner part 250 may substantially face the right side when viewed based on the drawings.

The inner surface 254 of the corner part 250 may be opposite to the outer surface 251 and may extend inward of the electronic device 100. The inner surface 254 of the second part 250 and the outer surface 251 of the second part 250 may be connected with each other through a curved surface. The recess 253 may be formed in the inner surface 254 of the second part 250. The support surface 252 may extend inward (e.g., the second direction) of the electronic device 100 from the inner surface 254.

Referring to FIG. 8A, the corner part 250 of the side member 200 may include a metal part 204 that includes a metal material, and a polymer part 203 coupled to the metal part 204, extending inward (the direction of facing the space between the first cover 120 and the second cover 180 in FIG. 3) of the electronic device 100, and including a polymer material. The polymer part 203 of the side member 200 may be injection-molded in the metal part 204.

In an embodiment, the outer surface 251 of the corner part 250 of the side member 200 may be formed by the metal part 204. At least a portion of the inner surface 254 of the corner part 250 may be formed by the polymer part 203. The recess 253 formed in the inner surface 254 of the corner part 250 may be formed by the polymer part 203. At least a portion of the inner surface 254 of the corner part 250 may be formed by the polymer part 203.

Referring to FIG. 8A, the polymer part 203 and the metal part 204 may be coupled to each other through the surface contact therebetween. Accordingly, the coupling strength between the metal part 204 and the polymer part 203 may be increased as the contact surface is increased.

Referring to FIG. 8A, the metal part 204 and the polymer part 203 may be shape-coupled to (engaged with) each other. For example, one or more recesses 253 may be formed in the contact surface between the polymer part 203 and the metal part 204, and the polymer part 203 may be formed inside the recess 253. Accordingly, the contact area (e.g., the area of the inner surfaces of the first recess 261 and the second recess 263) between the metal part 204 and the polymer part 203 may be increased such that the strong coupling strength is maintained.

According to an embodiment, the recess 253 formed in the metal part 204 may be recessed outward (e.g., the third direction) of the electronic device 100 from the contact surface with the metal part 204. Accordingly, the polymer part 203 and the contact surface between the polymer part 203 and the metal part 204 may not be exposed to the outside of the electronic device 100. When an external impact is applied to the electronic device 100, the polymer part 203 may not be directly impacted. Accordingly, the polymer part 203 having relatively weaker strength may be protected. In addition, referring to FIG. 8A, the contact surface (e.g., the inner surface of the recess 253) between the metal part 204 and the polymer part 203 is surrounded by the metal part 204, thereby preventing the polymer part 203 from being separated from the metal part 204.

In an embodiment, the metal part 204 may include a contact surface with which the polymer part 203 makes contact. The first recess 261 and the second recess 263 may be formed in the contact surface.

In an embodiment, the first recess 261 may include a first inner surface 2621 extending from the inner surface 254 of the corner part 250, a second inner surface 2622 connected with the first inner surface 2621, a third inner surface 2623 connected with the second inner surface 2622, a fourth inner side surface 2624 connected with the third inner surface 2623, a fifth inner surface 2625 connected with the fourth inner surface 2624, and a sixth inner surface 2626 connected with the fifth inner surface 2625.

In an embodiment, the first inner surface 2621 may extend inward of the metal part 204 from an area, which is formed by the metal part 204, of the inner surface 254 of the corner part 250. The second inner surface 2622 may extend in the fourth direction, which is opposite to the first direction, from the first inner surface 2621 while facing inward (e.g., the second direction) of the electronic device 100. The first inner surface 2621 and the third inner surface 2623 may be formed at both ends of the second inner surface 2622, and may face each other. The first inner surface 2621 and the third inner surface 2623 may include inclined surfaces having a gap therebetween increasing inward (e.g., the second direction) of the electronic device 100. Any one of the first inner surface 2621 and the third inner surface 2623 may face any direction between the second direction and the first direction and a remaining one of the first inner surface 2421 and the third inner surface 2423 may face any direction between the second direction and the fourth direction have. The first inner surface 2621 and the third inner surface 2623 may include inclined surfaces that are inclined to face each other at a specific angle. The fourth inner surface 2624 may face the sixth inner surface 2626 and may face inward (e.g., the second direction) of the electronic device 100. The fifth inner surface 2625 may be provided in a substantially curved surface facing the first direction. The fourth inner surface 2624 and the sixth inner surface 2626 may be formed at both ends of the fifth inner surface 2625. The fourth inner surface 2624 and the sixth inner surface 2626 may face each other.

In various embodiments, the fourth inner surface 2624 and the fifth inner surface 2625 of the first recess 261 may be connected with each other while forming a step 264 therebetween.

In an embodiment, the first recess 261 may be formed in the contact surface of the metal part 204 making contact with the polymer part 203. The first recess 261 includes a bottom surface (e.g., the fifth inner surface 2625) facing the first direction, first inner sidewalls (e.g., the sixth inner surfaces 2626) formed at both ends of the bottom surface, and second inner sidewalls (e.g., including the first inner surface 2621, the second inner surface 2422, and the third inner surface) facing the first inner sidewall. The first inner sidewall may be formed at the inner part of the electronic device 100, rather than the second inner sidewall. The second inner sidewall may have an additional recess (e.g., defined by the first inner surface 2621, the second inner surface 2622, and the third inner surface 2623) formed outward of the electronic device 100. The second recess 263 may include a bottom surface (e.g., the second inner surface 2622), third inner sidewalls (e.g., first inner surfaces 2621) formed at opposite ends of the bottom surface, and fourth inner sidewalls (e.g., the third inner surface 2623) facing the third inner sidewalls. The third inner sidewall may be connected with an area, which is formed by the metal part 204, of the inner surface 254 of the corner part 250. The third inner sidewall and the fourth inner sidewall may include inclined surfaces. The inclined surface included in the third inner sidewall may face at least inward of the electronic device 100. Accordingly, the polymer part 203 formed inside the recess is covered by the metal part 204 and/or the first cover 120 not to be exposed to the outside of the electronic device 100, and may be protected by the metal part 204. In addition, the contact surface between the polymer part 203 and the metal part 204 is covered by the metal part 204, thereby preventing the polymer part 203 from being separated from the metal part 204 when an impact is applied to an outer portion of the electronic device 100.

According to an embodiment, the metal part 204 may further include the second recess 263 recessed outward (e.g., the third direction) of the electronic device, and the polymer part 203 may be formed in the second recess 263.

Referring to FIG. 8B, the corner curved part 1203 of the first cover 120 may include the first surface 121 forming the first surface 110A of the electronic device 100, the second surface 122 facing the display 130, and an end surface 123 formed at the end of the corner curved part 1203. The end surface 123 may be interposed between the first surface 121 and the second surface 122. A fillet and a chamfer 124, which are inclined, may be formed between the end surface 123 and the first surface 121, and between the end surface 123 and the second surface 122, respectively.

Meanwhile, the display 130 may be disposed below the first cover 120, and a portion (e.g., the edge) of the display 130 may be supported by the polymer part 203 of the side member 200. The area, which corresponds to the corner curved part 1203 of the first cover 120, of the display 130 may be provided in the form of a curved surface corresponding to the corner curved part 1203 of the first cover 120.

In the illustrated embodiment, the side member 200 may include the inner surface 254 facing the end surface 123 of the first cover 120, the recess 253 formed in the inner surface 254, the corner curved part 1203 of the first cover 120 facing the recess 253, and a support surface 252 extending inward of the electronic device 100 from the recess 253 to support the display 130. At least a portion of the inner surface 254 may include a metal material. At least some of the recess 253 and the support surface 252 may include a polymer material. The support surface 252 includes the polymer part 203 having the strength weaker than the strength of the metal part 204, thereby absorbing a portion of external impact applied to the display 130. Accordingly, the display 130 may be prevented from being broken.

In an embodiment, the end surface 123 of the first cover 120 may be spaced apart from the inner surface 254 of the side member 200 by a specific distance. In an embodiment, the end surface 123 of the first cover 120 and the inner surface 254 of the side member 200 may be arranged to form a specific angle therebetween.

Referring to FIG. 8B, the distance Di, which is illustrated, may refer to a length of a line extending to the inner surface 254 of the side member 200 in a direction of a normal vector to the end surface 123 from the first area of the end surface 123. The distance Do may refer to the length of the line extending to the inner surface 254 of the side member 200 in the normal vector to the end surface 123 from the second area of the end surface 123. According to an embodiment, the distance Di may be greater than the distance Do. In various embodiments, the distance Do may be in the range of 0.10 mm to 0.20 mm Preferably, the distance Do may be 0.15 mm.

In various embodiments, the first area of the end surface 123 may be positioned at an inner part of the electronic device 100, rather than the second area of the end surface 123. Alternatively, the first area of the end surface 123 may be closer to the support surface 252 when compared to the second area of the end surface 123. In an embodiment, the distance between the first area of the end surface 123 and the inner surface 254 of the side member 200 may be longer than the distance between the second area of the end surface 123 and the inner surface 254 of the side member 200.

In an embodiment, the side member 200 and the first cover 120 may form a housing structure. In this case, a specific distance may be formed between the end surface 123 of the first cover 120 and the inner surface 254 of the side member 200. The distance may be reduced toward the outside of the housing structure from the inside of the housing structure.

In an embodiment, the normal vector "n1" to the end surface 123 and the normal vector "n2" to the inner surface 234 may form an angle of "$\theta_c$". In an embodiment, the angle of "$\theta_c$" may refer to an angle formed between the extension direction of the end surface 123 and the extension direction of the inner surface 234. In various embodiments, the angle of "$\theta_c$" may be in the range of 5° to 20°. Preferably, the angle of "$\theta_c$" may be 10°.

In an embodiment, the outer surface 251 of the side member 200 may include a curved area (e.g., the first curved area 2111) connected with the inner surface 254 of the side member 200, and one or more planar areas connected with the curved area and facing in mutually different directions.

The outer surface 251 of the corner part 250 of the side member 200 may include a first curved area 2511 connected with the inner surface 254 of the corner part 250 of the side member 200, a first planar area 2512 connected with the first curved area 2511, and a second planar area 2513 connected with the first planer area 2512.

In various embodiments, the first curved area 2511 may have a radius of curvature R1. For example, the radius of curvature R1 may be 0.15 mm. The first planar area 2512 and the second planar area 2513 are formed to face any direction between the first direction and the second direction. In this case, the direction that the first planar area 2512 faces may be closer to the first direction, rather than the direction that the second planar area 2513 faces. In other words, the angle between the direction that the first planar area 2512 faces and the first direction may be smaller than the angle between the direction that the second planar area 2513 faces and the first direction. The first planar area 2512 and the second planar area 2513 may be arranged to form a specific angle, for example, the specific angle may be 20 degrees Referring to FIG. 8C, the inclined surfaces (e.g., the first inner surface 2621 and the third inner surface 2623 of the first recess 261) included in the metal part 204 of the corner part 250 of the side member 200 may be formed through at least two cutting processes.

First, a first tool 310 moves in the z-axis direction, at least a portion of the recess 261 may be formed. In this case, the bottom surface (e.g., the fifth inner surface 2525) of the first recess 261 may include a curved surface. In this case, the first tool 310 may be formed in the shape of a cylinder having a bottom surface provided in the form of a circular planar surface. The second tool 320 may be a tool coupled to the rotational axis and including a first circular surface having a first diameter, and a second circular surface having a second diameter greater than the first diameter.

In a typical CNC process, a tool (e.g., a ball tool) having a protruding bottom surface (e.g., cutting surface) is used. When the recess is machined by using the ball tool, cutting is more performed from a reference surface (e.g., a surface formed along a tool path), so the strength may be weakened in the metal part 204 of the side member 200.

Accordingly, in an embodiment, the metal part 204 of the side member 200 of the electronic device 100 may be cut and formed by a flat tool (e.g., the first tool 310 and the second tool 320) having a bottom surface (cutting surface) provided in the planar form as illustrated in drawings.

In an embodiment, regarding the curved surface, the first part 210 has a height higher than the height of the second part 230 in the first direction. Accordingly, the height of the bottom surface in the z-axis direction (e.g., the first direction) may be increased toward the first recess (e.g., the first recess 221 of FIG. 6A) of the first part from the recess (the first recess 241 of FIG. 7A) of the second part. The first tool 310 to cut the metal part 204 may move along a tool path including the displacement in the z-axis direction (e.g., the first direction), based on the height difference.

In detail, the tool path may include the displacement in a −z-axis direction (e.g., the fourth direction) when the first tool 310 moves from the first part 210 to the second part 230. In addition, the tool path may include the displacement in the +z-axis direction (e.g., the first direction) when the first tool 310 moves from the second part 230 to the first part 210.

Accordingly, a portion of the cutting surface of the first tool 310 may move along the tool path previously set while making line-contact with the metal body.

For example, according to the process of forming the recess in the corner part 250, the tool path is defined in a three-dimensional coordinate system of an x-y-z plane, which is different from the process (see FIG. 6A) for the first part 210 or the process (see FIG. 7C) for the second part 230, which has the tool path defined only the x-y plane. Accordingly, the cutting surface and the metal body of the first tool 310 may partially make line contact with each other.

Meanwhile, since the tool includes a bottom surface in the shape of a cylinder, the line contact part may have an arc shape or an oval shape. Alternatively, the line contact part may be a curve like a parabola.

Thereafter, the second tool 320 moves outward (e.g., the third direction) of the electronic device inside the first recess 261, so the second recess 263 may be formed in the second inner sidewall of the first recess 261. The second recess 263 may include an inclined surface.

In an embodiment, it is preferred that only a one-directional load may be applied to the second tool 320 in the second cutting process to form the inclined surface. To this end, the second tool 320 may form an additional recess 253 as the second tool 320 moves in the state that the second tool 320 is spaced apart from the bottom surface of the first recess 261 formed through the first cutting process by a specific distance g2. In the second cutting process, the load may not be applied to the second tool 320 in the first direction (e.g., the z-axis direction). Accordingly, the second tool 320 may be prevented from being broken.

Referring to FIGS. 6 to 8, the inner surface 254 of the side member 200 and the end surface 123 of the first cover 120 may form a specific angle. In various embodiments, the first part 210 may form a first angle $\theta_a$ with the end surface 123 of the first curved part 1201 of the first cover 120. The second part 230 may form a second angle $\theta_b$ with the end surface 123 of the second curved part 1202 of the first cover 120. The corner part 250 may form a third angle $\theta_c$ with the end surface 123 of the corner curved part 1203 of the first cover 120. In various embodiments, the first angle $\theta_a$ may be formed to be smaller than the second angle $\theta_b$. The third angle $\theta_c$ may be formed to be smaller than the first angle $\theta_a$.

After the undercutting process for the metal part 204 using the first tool 310 and the second tool 320 is performed as described above, the polymer part 203 may be injection-molded. After the polymer part 203 is injection-molded, some of the polymer part 203 and the metal part 204 may be cut. The outer surface 251 and the inner surface 254 may be formed through cutting. The inner surface 254 may be formed therein with a recess 253 in which the corner curved part 1203 of the first cover 120 is received. In addition, the support surface 252 having a curvature corresponding to the curvature of the edge of the display 130 may be formed Referring to FIGS. 6 to 8, the inner surface 254 of the side member 200 may form a specific angle with respect to an x-y plane. The inner surface 254 of the first part 210 may be formed with a greater angle, as compared to the inner surface 254 of the second part 230. The inner surface 254 of the corner part 250 may be formed with a smaller angle as compared to the inner surface 254 of the first part 210 and, may be formed with a greater angle, as compared to the inner surface 254 of the second part 230.

Referring to FIGS. 6 to 8, the inner surface 254 of the side member 200 and the end surface 123 of the first cover 120 may have a specific distance therebetween. In various embodiments, the first part 210 may form a first distance from the first curved part 1201 of the first cover 120. The second part 230 may form a second distance from the second curved part 1202 of the first cover 120. The corner part 250 may form a third distance from the corner curved part 1203 of the first cover 120. In various embodiments, the first distance may be greater than the second distance. The third distance may be formed to be smaller than the first distance and greater than the second distance.

The distances are to minimize that an impact applied to the side member 200 is transmitted to the first cover 120. In addition, parts (the first part 210, the second part 230, and the corner part 250) of the side member 200 are formed to have mutually different distances from parts (the first curved part 1201, the second curved part 1202, and the corner curved part 1203) of the first cover 120. This is because, the intensities of impacts transmitted to the first cover 120 may are different from each other depending on the parts of the side member 200. The details thereof will be described in detail with reference to FIG. 9.

Figure 9:
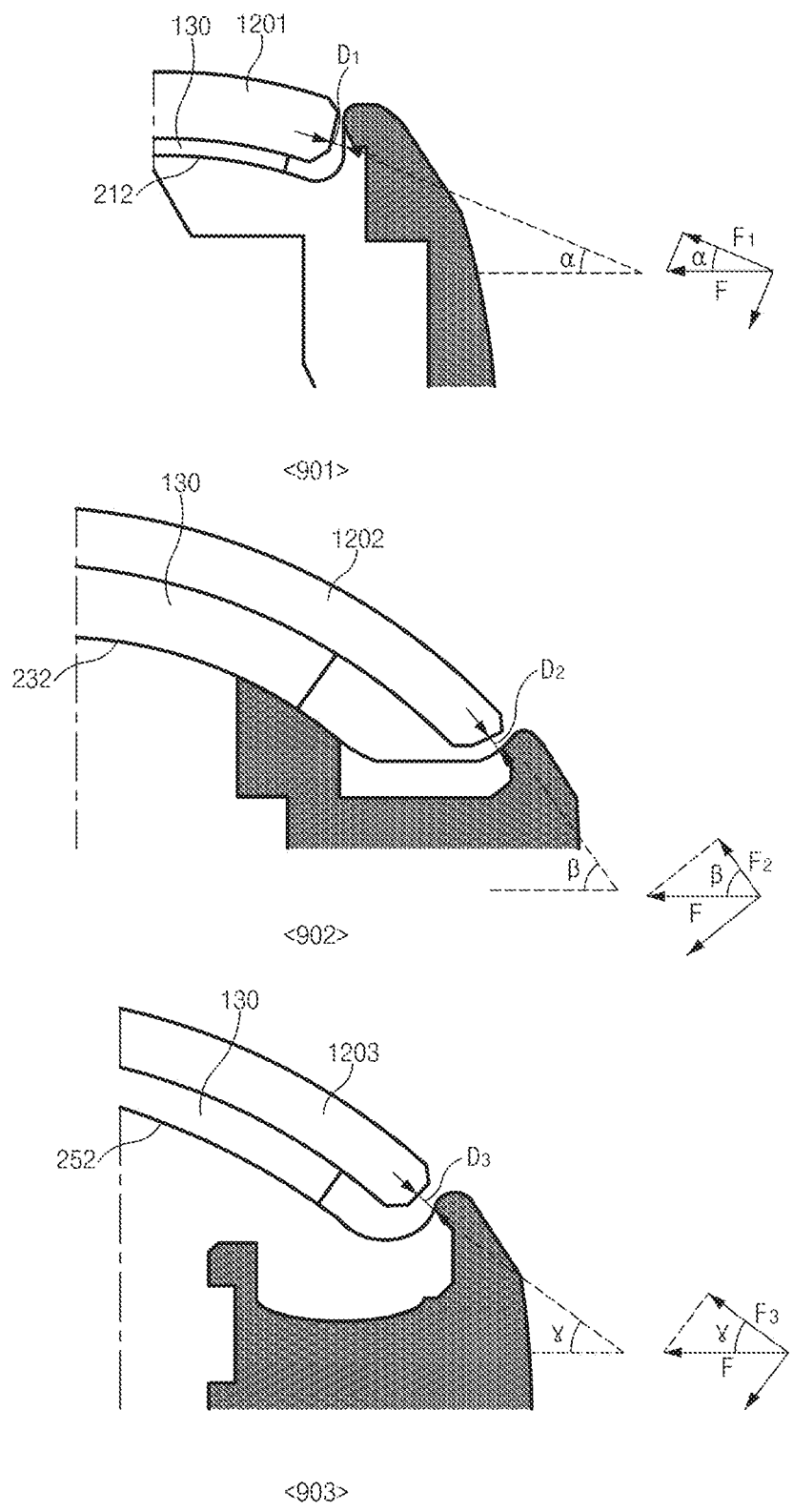
FIG. 9 is a view illustrating impacts applied to a cover of an electronic device when the impacts are applied to parts of a side member of the electronic device, according to various embodiments of the disclosure.

FIG. 9 illustrates impacts applied to the first cover 120 when the impacts F are applied to the parts of the side member 200 of the electronic device 100, according to an embodiment of the disclosure. Reference numerals <901>, <902>, and <903> relate to the first part, the second part, and the corner part of the side member, respectively.

Referring to FIG. 9, in an embodiment, the angle between the direction that the end surface 123 of the first cover 120 faces and the horizontal surface may be varied at each of the first curved part 1201, the second curved part 1202, and the corner curved part 1203.

An angle ($\alpha$) of the end surface 123 of the first curved part 1201 may be smaller than an angle ($\beta$) of the end surface 123 of the second curved part 1202. An angle ($\gamma$) of the end surface 123 of the corner curved part 1203 may be smaller than the angle ($\beta$) of the end surface 123 of the second curved part 1202 and may be smaller than the angle (a) of the end surface 123 of the first curved part 1201. Referring to FIG. 9, $\beta > \alpha \geq \gamma$ may be satisfied.

Accordingly, the impact applied to the first cover 120 by the impact F applied to the side member 200 in the horizontal direction may be reduced as the angle between the direction that the end surface 123 faces at the curved parts 1201, 1202, and 1203 and the horizontal surface is increased. Referring to FIG. 9, F3≥F1>F2 may be satisfied. In other words, when the impact is applied to the first part 210 of the side member 200 and the corner part 250, the first cover 120 may be easily broken. In particular, the corner part 250 is smaller than the first part 210 or the second part 230 in area to absorb an impact. Accordingly, the corner part 250 may be weaker in impact.

Referring back to FIG. 5, the polymer part 203 may be more included in the second part 230, rather than the first part 210 and the corner part 250. The polymer part 203 may be more provided in parts (e.g., the corner part 250 and the first part 210) weaker in impact to absorb the impact. For example, a portion of the polymer part 203 is larger adjoining the first part 210 than a portion of the polymer part 203 adjoining the second part 220. For example, a portion of the polymer part 203 is larger adjoining the corner part 250 than a portion of the polymer part 203 adjoining the first part 210.

Meanwhile, according to an embodiment, the electronic device may be formed, such that the curved parts 1201, 1202, and 1203 of the first cover 120 are spaced apart from inner surfaces of the parts 210, 230, and 250 of the side member 200, respectively, by respective specific distances D1, D2, and D3, based on that impact is applied to the first cover 120 with different intensities depending on the parts 210, 230, and 250 of the side member 200. As the specific distances are increased, the impacts F1, F2, and F3 applied to the first cover 120 may be reduced. According to an embodiment, the electronic device 100 may be formed such that the distances are reduced outward (e.g., the second direction) of the electronic device 100, based on an aesthetic impression in outer portion of the electronic device 100.

In addition, according to an embodiment, the electronic device 100 may be formed such that the distance D1 between the first part 210 and the first curved part 1201 and/or the distance D3 between the corner part 250 and the corner curved part 1203 is greater than the distance D2 between the second part 230 and the second curved part 1202.

In particular, the distance D3 between the corner part 250 and the corner curved part 1203 may be formed to have the longest distance, based on the weakness of the corner part 250 in impact.

In an embodiment, the polymer part 203 of the side member 200 is covered by the metal part 204 of the first cover 120, the second cover 180, and the side member 200 such that the polymer part 203 is not exposed through the outer surface of the electronic device 100.

In the CNC process for the metal part (see FIGS. 6A, 7C, and 8C), the gap may be formed in the contact surface between the polymer part 203 and the metal part 204. When the polymer part 203 is exposed through the outer surface of the electronic device 100, the gap may be exposed, together with the polymer part 203, through the outer surface of the electronic device.

The gap, which is exposed through the outer surface of the electronic device as described above, is not proper in terms of the aesthetic impression of the outer appearance of the electronic device 100. In addition, an electrolytic solution penetrates through the gap during the anodizing process for coloring the metal part, so the coloring of the outer portion of the metal part may be defective (e.g., housing defects).

Therefore, according to an embodiment, in the electronic device 100, the polymer part 203, and the contact surface between the metal part 204 and the polymer part 203 are covered by the metal part 204, the first cover 120, and the second cover 180, so that the polymer part 203 and the contact surface between the metal part 204 and the polymer part 203 are not exposed through the outer surface of the electronic device 100.

According to various embodiments, an electronic device may include a housing including a first glass plate, a second glass plate opposite to the first glass plate, and a side member to surround a space between the first glass plate and the second glass plate, and a touch screen display disposed in the space and viewed through at least a portion of the first glass plate. The first glass plate may include a rectangular planar part including a first edge, which faces outward in a first direction and has a first length, and a second edge which extends perpendicularly to the first edge and has a second length longer than the first length, a first curved part including a first surface which extends from the first edge to a first part of the side member and faces the first part, and a second curved part including a second surface which extends from the second edge to a second part of the side member and faces the second part. Each of the first part and the second part of the side member may include a metal part that forms an outer surface of the housing, and has a first inner surface facing the space in a second direction perpendicular to the first direction, and a polymer part that makes contact with the first inner surface and defines a recess to receive the first glass plate together with the metal part.

The metal part of the second part may include a second inner surface extending from the first inner surface and substantially facing the second surface of the second curved part, a third inner surface extending from the second inner surface and facing the second direction, and a fourth inner surface extending from the third inner surface and facing the first direction. The polymer part may make contact with the second inner surface to the fourth inner surface.

According to various embodiments, a first angle formed by the first surface and the first inner surface may be smaller than a second angle formed by the second surface and the second part.

According to various embodiments, the polymer part may include a central part corresponding to the rectangular planar part of the first glass plate, and a rim part corresponding to the first curved part and the second curved part of the first glass plate. The polymer part may be more formed at the rim part, rather than the central part.

According to various embodiments, the rim part of the polymer part may include a first rim part corresponding to the first curved part and a second rim part corresponding to the second curved part. The polymer part may be more formed at the first rim part, rather than the second rim part.

According to various embodiments, the metal part of the first part may include a recess formed in a direction opposite to the second direction, a polymer part being formed inside the recess. The recess may include a bottom surface facing the second direction, a first inner sidewall formed on the bottom surface and connected with the first inner surface, and a second inner sidewall facing the first inner sidewall. The first inner sidewall may include an inclined surface connected with the first inner surface.

According to various embodiments, the recess may include a first part formed at a first depth and a second part formed at a depth greater than the first depth.

According to various embodiments, the first glass plate may include a corner curved part formed between the first curved part and the second curved part, and the side member may include a corner part formed between the first part and the second part. The corner part of the side member may include the metal part that forms the outer surface of the housing, and has the first inner surface facing the space in the second direction perpendicular to the first direction, and the polymer part that makes contact with the first inner surface and forms the recess to receive the first glass plate together with the metal part. The metal part of the corner part may include a recess formed in a direction opposite to the second direction, the polymer part being formed inside the recess. The recess may include a bottom surface, a first inner sidewall formed on the bottom surface and connected with the first inner surface, and a second inner sidewall facing the first inner sidewall. The first inner sidewall may include inclined surfaces extending in a direction opposite to the second direction from the first inner surface and extending in a direction opposite to the first direction.

According to various embodiments, the bottom surface at least partially may include a curved surface, and the first inner sidewall may be is connected with the bottom surface while forming a step and includes a stepped surface formed in the first direction with respect to the bottom surface.

According to various embodiments, an electronic device may include a housing structure including a first cover forming a first surface of the electronic device, a second cover forming a second surface of the electronic device, and a side member forming a third surface between the first surface and the second surface of the electronic device, and a display interposed between the first cover and the second cover. The side member may include a metal part forming the third surface of the electronic device and at least partially forming an inner surface of the side member, and a polymer part extending between the display and the second cover, from the metal part. The first cover may include a planar part facing a first direction, and a curved part curved toward the inner surface of the side member while surrounding the planar part. The curved part includes an end surface spaced apart from the inner surface of the side member by a specific distance while facing the inner surface of the side member.

According to various embodiments, the specific distance may be reduced outward from an inner part of the housing structure.

According to various embodiments, the metal part may include a contact surface defined by the polymer part. At least one recess may be formed in the contact surface, and the polymer part may be formed in the at least one recess.

According to various embodiments, the metal part may be formed or the first cover may be disposed in the first direction at the polymer part formed in the recess.

According to various embodiments, the polymer part may form a support surface to support at least a portion of the curved part of the display.

According to various embodiments, the support surface may include a curved surface having a curvature corresponding to the curved part of the display.

According to various embodiments, the first cover may include a first surface forming the first surface of the electronic device, and a second surface supported on the display. The end surface of the first cover may be interposed between the first surface and the second surface.

According to various embodiments, the side member may include a first part having a first length and extending in a second direction perpendicular to the first direction, and a second part extending in a third direction perpendicular to the first direction and the second direction and having a second length longer than the first length. The inner surface included in the first part of the side member may extend in a direction spaced apart from the first direction at a first angle. The inner surface included in the second part of the side member may extend in a direction spaced apart from the first direction at a second angle, and the second angle may be greater than the first angle.

According to various embodiments, the side member may include a corner part interposed between the first part and the second part and connecting the first part with the second part. The inner surface included in the corner part of the side member may extend in a direction spaced apart from the first direction at a third angle. The third angle may be formed to be smaller than the first angle and greater than the second angle.

According to various embodiments, the inner surface included in the first part of the side member may form a fourth angle with the end surface of the curved part of the first cover, the inner surface included in the second part of the side member may form a fifth angle with the end surface of the curved part of the first cover, and the fourth angle may be smaller than the fifth angle.

According to various embodiments, the metal part included in the first part of the side member may include a curved area connected with the polymer part forming the inner surface of the side member and a planar area connected with the curved area and facing the first direction.

Hereinafter, those of ordinary skill in the art will recognize that modification, equivalent, and/or alternative on the various embodiments described herein can be variously made without departing from the scope and spirit of the disclosure. With regard to description of drawings, similar components may be marked by similar reference numerals. The terms of a singular form may include plural forms unless otherwise specified. In this disclosure, the expressions "A or B", "at least one of A and/or B", "A, B, or C" or "at least one of A, B and/or C", and the like may include any and all combinations of one or more of the associated listed items. The terms, such as "first", "second", and the like may be used to refer to various components regardless of the order and/or the priority and to distinguish the relevant components from other components, but do not limit the components. When an component (e.g., a first component) is referred to as being "(operatively or communicatively) coupled with/to" or "connected to" another component (e.g., a second component), the component may be directly coupled with/to or connected to the other component or an intervening component (e.g., a third component) may be present.

According to the situation, the expression "adapted to" or "configured to" used in this disclosure may be used as, for example, the expression "suitable for", "having the capacity to", "adapted to", "made to", "capable of", or "designed to" in hardware or software. The expression "a device configured to" may mean that the device is "capable of" operating together with another device or other parts. For example, a "processor configured to (or set to) perform A, B, and C" may mean a dedicated processor (e.g., an embedded processor) for performing corresponding operations or a generic-purpose processor (e.g., a central processing unit (CPU) or an AP) which performs corresponding operations by executing one or more software programs which are stored in a memory device (e.g., the memory.)

The term "module" used in this disclosure may include a unit composed of hardware, software and firmware and may be interchangeably used with the terms "unit", "logic", "logical block", "part" and "circuit". The "module" may be an integrated part or may be a minimum unit for performing one or more functions or a part thereof. The "module" may be implemented mechanically or electronically and may include at least one of an application-specific IC (ASIC) chip, a field-programmable gate array (FPGA), and a programmable-logic device for performing some operations, which are known now or will be developed.

At least a part of an apparatus (e.g., modules or functions thereof) or a method (e.g., operations) according to various embodiments may be, for example, implemented by instructions stored in computer-readable storage media (e.g., the memory in the form of a program module. The instruction, when executed by a processor (e.g., the processor) may cause the processor to perform a function corresponding to the instruction. A computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), and an internal memory. Also, the one or more instructions may contain a code made by a compiler or a code executable by an interpreter.

Each component (e.g., a module or a program module) according to various embodiments may be composed of single entity or a plurality of entities, a part of the above-described sub-components may be omitted, or other sub-components may be further included. Alternatively or additionally, after being integrated in one entity, some components (e.g., a module or a program module) may identically or similarly perform the function executed by each corresponding component before integration. According to various embodiments, operations executed by modules, program modules, or other components may be executed by a successive method, a parallel method, a repeated method, or a heuristic method, or at least one part of operations may be executed in different sequences or omitted. Alternatively, other operations may be added.

According to embodiments disclosed in the disclosure, the display glass may be supported by the soft injection, so the display glass is prevented from being broken.

Besides, a variety of effects directly or indirectly understood through the disclosure may be provided.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
a first cover forming a first surface of the electronic device;
a second cover forming a second surface of the electronic device;
a side member surrounding an inner space between the first cover and the second cover; and
a display disposed in the inner space and viewed through at least a portion of the first cover,
wherein the side member includes a metal portion forming a third surface between the first surface and the second surface of the electronic device and a polymer portion bonded to the metal portion,
wherein the polymer portion includes a first portion facing an edge of the first cover and/or an edge of the second cover, and
wherein, when viewed in a direction substantially perpendicular to the third surface, the first portion of the polymer portion is covered by the metal portion such that the first portion is invisible from an outside of the electronic device.

2. The electronic device of claim 1,
wherein the polymer portion includes a support surface on which the display is seated and extends from the first portion.

3. The electronic device of claim 1,
wherein the side member includes an outer surface forming the third surface of the electronic device and an inner surface opposite to the outer surface, and
wherein the inner surface is provided by the first portion of the polymer portion and a second portion of the metal portion.

4. The electronic device of claim 3,
wherein the second portion of the metal portion is positioned closer to the third surface of the electronic device than the first portion of the polymer portion.

5. The electronic device of claim 3,
wherein a recess is provided in the second portion of the metal portion, and
wherein at least portion of the polymer portion is accommodated in the recess.

6. The electronic device of claim 1,
wherein an inner surface of the side member includes a first area formed by the polymer portion, and a second area formed by the metal portion, and
wherein the edge of the first cover and/or the second cover are spaced apart from the first area at a first distance, and spaced apart from the second area at a second distance smaller than the first distance.

7. The electronic device of claim 1,
wherein the metal portion includes a second portion facing the edge of the first cover and/or the edge of the second cover and bonded to the first portion of the polymer portion, and
wherein the second portion is provided to at least partially surround the first portion of the polymer portion.

8. The electronic device of claim 1,
wherein the metal portion includes a second portion facing the edge of the first cover and/or the edge of the second cover and bonded to the first portion of the polymer portion, and
wherein the second portion protrudes further toward the edge of the first cover and/or the edge of the second cover compared to the first portion of the polymer portion.

9. The electronic device of claim 1,
wherein the first portion of the polymer portion is spaced apart from the edge of the first cover and/or the edge of the second cover at a gap, and
wherein the first portion of the polymer portion is at least partially bent so that the gap increases from a portion adjacent to a surface of the electronic device to a portion adjacent to the inner space.

10. The electronic device of claim 1,
wherein the metal portion includes a second portion facing the edge of the first cover and/or the edge of the second cover and bonded to the first portion of the polymer portion, and
wherein the second portion of the metal portion is spaced apart from an edge of the first cover and/or an edge of the second cover.

11. The electronic device of claim 1,
wherein the first cover includes a first planar area facing a first direction, and a first curved area extending by bending from the first planar area and including the edge of the first cover, and
wherein the second cover includes a second planar area facing a second direction opposite to the first direction, and a second curved area extending by bending from the second planar area and including the edge of the second cover.

12. The electronic device of claim 11,
wherein, when the electronic device is viewed in a third direction substantially perpendicular to each of the first direction and the second direction, the first portion of the polymer portion is invisible from an outside of the electronic device.

13. The electronic device of claim 11,
wherein, when the electronic device is viewed in the first direction or the second direction, the first portion of the polymer portion is invisible from an outside of the electronic device.

14. The electronic device of claim 11,
wherein, when the electronic device is viewed in a third direction substantially perpendicular to each of the first direction and the second direction, the edge of the first cover and/or the edge of the second cover is overlapped by the metal portion of the side member.

* * * * *